United States Patent [19]

Brown et al.

[11] Patent Number: 5,627,842
[45] Date of Patent: May 6, 1997

[54] ARCHITECTURE FOR SYSTEM-WIDE STANDARDIZED INTRA-MODULE AND INTER-MODULE FAULT TESTING

[75] Inventors: Joseph H. Brown, Windham, Me.; Dilip K. Bhavsar, Shrewsbury, Mass.

[73] Assignee: Digital Equipment Corporation, Maynard, Mass.

[21] Appl. No.: 658,011

[22] Filed: Jun. 4, 1996

Related U.S. Application Data

[63] Continuation of Ser. No. 533,353, Sep. 25, 1995, abandoned, which is a continuation of Ser. No. 7,179, Jan. 21, 1993, abandoned.

[51] Int. Cl.$^6$ ..................................................... G06F 11/00
[52] U.S. Cl. ................ 371/22.3; 371/22.1; 371/22.5; 371/21.3; 395/500; 364/489; 364/490; 364/491
[58] Field of Search ........................ 371/22.3, 22.1, 371/22.5, 21.3; 324/158 R, 763; 395/500; 364/489, 490, 491

[56] References Cited

U.S. PATENT DOCUMENTS

| | | | |
|---|---|---|---|
| 4,720,672 | 1/1988 | Turino . | |
| 5,029,166 | 7/1991 | Jarwala et al. | 371/22.1 |
| 5,036,473 | 7/1991 | Butts et al. | 364/489 |
| 5,132,635 | 7/1992 | Kennedy | 324/763 |
| 5,150,044 | 9/1992 | Hashizume et al. | 324/763 |
| 5,155,432 | 10/1992 | Mahoney | 324/763 |
| 5,166,604 | 11/1992 | Ahanin et al. | 324/763 |
| 5,198,759 | 3/1993 | Ohnesorge | 324/158 R |
| 5,317,697 | 5/1994 | Husak et al. | 395/325 |
| 5,325,367 | 6/1994 | Dekker et al. | 371/21.1 OR |

OTHER PUBLICATIONS

Maunder and Tulloss, Test Access Port and Boundary–Scan Architecture, IEEE Computer Press Tutorial, 1990, entire document.
Bhakar, An Architecture for Extending the IEEE Standard 1149.1 Test Access Port to System Backplanes, Preprint 1991 International Test Conference.
Ohnesorge, Boundary Scan at Board and System Level A Position Independent Scan Architecture Akatel–SEL document, date unknown.

Primary Examiner—Emanuel T. Voeltz
Assistant Examiner—Kamini Shah
Attorney, Agent, or Firm—Cesari and McKenna, LLP

[57] ABSTRACT

Apparatus and method for hierarchical, centralized boundary-scan fault-testing of extended electronic circuits, including inter-board testing, within a unified, standard protocol. During this testing, each board is "viewable" from the central test control in the same way that it is viewable when standing alone, before being incorporated into an extended system. The preferred embodiment of the invention is based on IEEE Std 1149.1, and is to be used with integrated circuits compliant with that standard. Because of this, the IEEE Std 1149.1 test elements—including but not limited to extensive micro-code—prepared for the testing of the board individually can be incorporated into the system-wide testing. The invention makes use of a "parking" of integrated circuit test rings with any desired test vector in their boundary scan registers, so that they can subsequently be viewed from another board as part of inter-board fault testing. In its preferred embodiment the invention provides for the parallel coupling of all backplane slots to the standard test bus implicit in IEEE Std 1149.1. The coupling of test rings to the system test bus is through a SLOT Link apparatus that incorporates a Selection Controller (a three-state finite state machine in the preferred embodiment) for enabling one board to be selected for testing. an address facility ensuring that only one slot is selected at a time. Also included in the preferred embodiment test architecture on each board is a switching network and one or more Local Serial Port (LSP) Ring Controllers which, in the preferred embodiment, are four-state finite state machines. In this way a plurality of test rings on a single board can be flexibly configured for testing, so that a single test ring or several of the test rings in series are tested. These LSP Ring Controllers are also used to "park" the Test Rings for subsequent inter-board testing.

25 Claims, 16 Drawing Sheets

ARCHITECTURE FOR SYSTEM-WIDE STANDARDIZED INTRA-MODULE AND INTER-MODULE FAULT TESTING

CROSS-REFERENCE TO RELATED APPLICATIONS

This is a continuation of application Ser. No. 08/533,353, filed Sep. 25, 1995, which is now abandoned and which is itself a continuation of application Ser. No. 08/007,179, filed Jan. 21, 1993, now abandoned.

BACKGROUND OF THE INVENTION

1. Field of the Invention

This invention relates to automated testing of integrated-circuit (IC) components. More specifically, it relates to system-wide testing of powered-up electronic systems encompassing a multiplicity of IC-containing modules (e.g., printed circuit boards). More specifically yet, it relates to apparatus and protocol for a multi-drop application of IEEE Std 1149.1 to each board coupled in parallel to a system-level controller through a master test bus. It thereby extends the IEEE Std 1149.1 test protocol to the system level; furthermore, it permits the testing of inter-board connects as well as intra-board connects in a way that utilizes essentially all of the hardware and software elements previously developed for testing individual, isolated boards within IEEE Std 1149.1—such as the required micro-code. Finally, by providing a board-level ring controller, the present invention makes more flexible the testing of boards bearing more than a single IEEE Std 1149.1 ring of devices, while allowing a reduction in the number of edge connector pins for multi-ring boards.

2. Description of Prior Art

Introduction

From the earliest days of solid-state electronics, individual circuit components have been tested prior to incorporation into circuits, and completed circuits have been monitored for proper performance and operating characteristics. In the beginning, those individual components consisted of single transistors, rectifiers, and the like. It was simple to set up the appropriate test jigs for examining the isolated device and it was likewise simple in the completed circuit to gain access to the pins needed for in situ testing of the device—which could easily be replaced if it failed.

As the complexity of solid-state electronic circuits has grown, so too has testing complexity, along with the importance of maintaining testability. At the lowest level, this means ensuring the testability of individual devices (which are now integrated-circuit chips—ICs) before they are incorporated into more extended circuits, typically through being mounted on printed circuit boards. The testing of the individual chip does not differ qualitatively from that of the individual transistor in earlier times. In both cases, all of the pins used for connecting the device to the outside world are readily accessible for the application of test voltages and the sensing of device responses. In both cases, the goal is to detect unwanted "shorts" and "opens" and to determine whether the device "logic" is correct. Until recently, a similar carry-over of the testing technique was possible and practicable for the completed circuit, the board loaded with interconnected ICs. Using a "bed of nails" jig or its equivalent, the test circuit could be electrically connected to every node—i.e., to every point where the pin of one IC connected to the pin of another or to the outside world—in the circuit under test. This provided direct means for checking the completed circuit module—the loaded board—for shorted and open leads and for proper logic, prior to the module being inserted into an extended, multi-board system. (Typically a board is made part of a larger system by being inserted into a slot in a system backplane, the physical framework used for holding the various system constituents in proximity.)

The "bed of nails" approach has never been practicable for testing either an extended system or even an individual module once that module is included in an extended system. Moreover, the increasing device density on loaded boards (as well as the increasing number of pins per device) has made the "bed of nails" increasingly impracticable even for testing a single, isolated module. The final blow to this testing approach is being dealt by the introduction and rapid expansion of surface-mounted technology (SMT) for loading and interconnecting ICs on boards. SMT involves the replacement of IC pins by pedestals designed to be butted against contact pads on the circuit board. It generally leads to circuit nodes being inaccessible from the side of the board opposite the ICs. Furthermore, because all of the connections for devices are located on the same side as the devices themselves, SMT makes possible a double loading of boards, with devices being affixed on both sides, utilizing circuit nodes which are essentially concealed from outside access or view. Although probe points can be designed into any board—i.e., added specifically for testing purposes—this is very expensive and highly impracticable in essentially all cases. Thus, the SMT advance, made necessary by the continuing increase in logic density, promises to make "bed of nails" testing completely obsolete.

Electrical connections still accessible on an SMT-loaded circuit board are the electrical contacts by which the board is to be connected to the outside world; this generally means the contacts by which the board is to be connected to an extended system via backplane-slot terminals: its edge connectors. The use of these contacts to test the individual board, either immediately post-production or immediately prior to its insertion into an extended system, requires a level of interaction between test engineers and circuit-design engineers far beyond that previously necessary. There now has to be circuitry—a board test bus—coupling the edge connectors to key points within the circuit module; in general there may also need to be test-enabling architecture added to the chips. A brute-force approach would be to connect slot edge connector pins to test buses running to every node in the circuit module—maintaining, in effect, the testing simplicity of the "bed of nails" approach, and obviating the need of test architecture on the chip—but at the cost of a myriad of test leads and concomitant capacitive coupling. This is obviously not an acceptable solution for high-speed circuits operating in spacelimited (and pin-limited) environments.

The most widely-used approach to modern testing of high-density circuits uses the boundary-scan technique. Boundary-scan testing reduces to a minimum the number of test leads to be added to the board and the number of edge connector contacts needed for test purposes; it demands, however, a great deal more ingenuity and analysis on the part of the test engineer. It also demands cooperation not just from those designing and assembling circuit modules from individual ICs but also from those designing and manufacturing the ICs themselves. The "boundary" of boundary-scan testing is the IC boundary, the totality of input and output pins on the chip. To make possible the testing, certain logic circuitry (a "Boundary-Scan Cell") is interposed on each pin in such a way that this Boundary-Scan Cell separates the pin's external wire from its on-chip logic connection. Boundary-Scan Cells provide the means for mediating the testing and also for ensuring that the presence of the test connections does not compromise normal IC performance. To enable the testing of a circuit module, the individual ICs are daisy-chained together into a test ring, with a test lead connected in series to the Boundary-Scan Cell of every pin. (See FIG. 1, which shows that the total physical chip contains both the Boundary-Scan Cell architecture and the on-chip logic, with the external pins available for interconnection to other chips, just as before. The various control lines necessary to implement Boundary-Scan Cell testing are not shown in FIG. 1.)

Boundary-Scan Cells are designed so that collectively they provide a shift register into which a test stimulus—a pattern of logic-high and logic-low voltages—can be forced. Specifically, through the test input and the series connection of Boundary-Scan Cells, a binary number constituting the test stimulus can be shifted into this register, one bit per cell, under the intercession of control lines not shown in FIG. 1. Once shifted in, the test stimulus can be applied to the chip logic and the resulting output from the logic captured by the Boundary-Scan Cell shift register and stored. The test output is subsequently shifted out of the shift register as a binary number to be analyzed by the test controller for information concerning on-chip logic performance and pin integrity (and, for those rings containing more than one chip, interconnections).

The realization early on that Boundary-Scan testing circuitry could be structured in many different ways, and that many different test protocols—some well-suited to one module design but not to another—were bound to arise in an uncoordinated field, led to the development of an industry-wide Boundary-Scan testing standard. Through the Joint European Test Action Group (JETAG)—and the Joint Test Action Group (JTAG) to which it evolved—a standard has been established that should result in test-architecture and testprotocol uniformity throughout the industry. This standard is IEEE Std 1149.1 ("the standard"), ratified by the IEEE in February, 1990, and adopted by ANSI in August, 1990. Circuit boards loaded with standard-compliant devices connected together into test rings by standard-compliant local test buses accessible at the edge connectors ("standard-compliant boards" or "standard-compliant modules") constitute known entities for down-stream manufacturers and their test engineers, which means that module-testing schemes for the boards in question can be more efficiently planned and implemented.

JTAG-IEEE Std 1149.1 for Testing Individual Modules

IEEE Std 1149.1—also referred to as "JTAG"—specifies testability standards for a circuit module made up of a number of interconnected ICs ("chips") mounted on a circuit board or its equivalent. While not defining every detail of standard-compliant circuits, IEEE Std 1149.1 does specify minimum requirements to be met by every standard-compliant board and every standard-compliant chip.

IEEE Std 1149.1 is based in the individual chip, each of which must contain a Test Access Port (TAP), a TAP controller, an Instruction Register, and at least two Data Registers—one being the Boundary-Scan Register residing in the Boundary-Scan Cells, and the other a Bypass Register. Each chip's TAP must contain at a minimum three specific input pins—TCK (Test Clock), TMS (Test Mode Selector), and TDI (Test Data Input)—and one specific output pin—TDO (Test Data Output). An optional fifth TAP pin is for a Test Reset (TRST) line. Since there was no collective name assigned to this test architecture, common usage often refers the entire collection of test architecture on the chip "the TAP." Strictly speaking, "TAP" refers only to the collection of four or five test pins on the standard-compliant chip.

Corresponding to the four or five TAP pins associated with the individual chips, an external test bus joining a test control unit to the board has four or five leads: TCK, TMS, TDI, TDO, (TRST). On the standard-compliant board—thought of as holding a first chip, a second chip, etc., through an nth chip, the last chip—the external TDI lead is coupled directly to the TDI pin of the first chip's TAP. On the first chip and on each chip, the TDI pin is connected in series through all of the Boundary-Scan Cells, returning to the TDO pin of the TAP. The TDO pin of the first chip's TAP is then connected directly to the TDI pin of the second chip; the TDO pin of the second chip is connected directly to the TDI pin of the third chip; and so forth. The TDO pin of the last chip goes to the external test bus' TDO line. In contrast, the TCK and TMS leads of the external test bus are connected in parallel to the corresponding TAP pins of all of the individual chips. See FIG. 2. (It is noted that, although each standard-compliant board has been presented as just having a single ring of daisy-chained chips, the standard also provides for a board holding a number of such rings. Within IEEE Std. 1149.1, each ring is independent of the others. The presence of multiple test rings on a board simply means that there are several separate board test buses, with a corresponding increase in the number of edge connector pins dedicated to testing.)

The mechanics of the testing depend on the fact that each Boundary-Scan Cell is capable of transferring data (a) between its on-chip logic side and the pin by which the chip is connected to the rest of the system, (b) from its on-chip logic side to the next Cell, (c) from the previous Cell to itself, (d) from the previous Cell to the next Cell (where the "next Cell" is further from the TDI connect and closer to the TDO connect, and the "previous Cell" is in the opposite direction). Which of these transfers a particular Cell performs is determined by the control signals applied to that Cell from other parts of the test architecture, in particular from the TAP Controller, as described below. In response to the proper control inputs, the Cells will isolate the test circuitry from the operation of the chip and will itself become "transparent" to the ordinary operation of the chip as a unit in the extended system. Provided with different control inputs, the Cells will participate in chip-interconnect tests or in testing of the chip logic.

In general, the binary number constituting the test stimulus will have one bit for each of the pins from all the chips in the test Ring (with the least significant bit—LSB—residing in the Cell closest to the TDO line after the shifting in is completed). (It may be that some, or most, of the chips are not of interest to the testing. For such a chip the test stimulus—and resultant response—will be shifted not through that chip's entire Boundary-Scan Register but rather just through a one-bit Bypass Register specified by IEEE Std 1149.1. The length of the numbers shifted in and out will be reduced accordingly.) The shifting in of the test stimulus from the external test bus line TDI and the shifting out of the test data onto the external test bus line TDO are clocked by the TCK signal and mediated by control signals sent the Boundary-Scan Cells by the TAP Controller, which also regulates flow into the Instruction Register and is in turn controlled by TMS and TCK. The TCK signal is a uniform pulse train serving to synchronize the various test events, which are triggered either by the rising edge or the falling edge of the first TCK pulse to arrive at the relevant controller or register subsequent to certain conditions precedent being met. The TMS signal forms the heart of a particular testing protocol and is shaped by the test controller to be a series of logic-high and logic-low levels of irregular duration. These levels drive the testing, in particular by driving the TAP Controller, as described below. TMS level changes are generally made to occur on the falling edge of a TCK pulse so as to be as far as possible from a rising edge, the trigger for most test events.

The standard-compliant TAP Controller is a sixteen-state finite state machine ("machine") which at any instant will be in a state determined by its initial state and the subsequent sequence of TMS signals received. The state that the TAP Controller is in determines the control signals it sends to the rest of the test architecture, in particular to the Boundary-Scan Cells. Part of the IEEE Std 1149.1 definition of the TAP Controller is, therefore, a definition of what the control signal outputs to other parts of the test architecture are to achieve for each TAP Controller state.

FIG. 3 shows the TAP Controller state diagram along with the protocol for state changes. State events are triggered by each rising edge of TCK and are determined by the TMS logic level at that instant. The arrows and associated 0's and 1's at each of the sixteen states indicate what the TAP Controller will do upon receiving a TCK rising edge, depending upon whether TMS is logic-low or logic-high, respectively. For example, if the TAP Controller is in the Select-IR-Scan state, it will—on the next TCK rising edge—go to the Test-Logic-Reset state if, and only if, TMS is logic-high at that time. If TMS is logic-low, the TAP Controller will change to the Capture-IR state. For another example, note from FIG. 3 that if the TAP Controller is in the Shift-IR state, it will remain in that state as long as TMS remains low.

IEEE Std 1149.1 requires that the TMS and TDI inputs to the chip test architecture be logic-high should they not be driven by an external signal (i.e., that the TMS and TDI inputs be stuck-at-high if, for example, the corresponding lines in the external test bus be open). It can be seen from FIG. 3, that a stuck-at-high TMS will drive the TAP Controllers back to the Test-Logic-Reset state—the state which de-couples the chip logic from the test circuitry—regardless of where they start (providing that TCK continues to function). For example, if the starting state is Exit1-IR, each TAP Controller will be driven in four TCK ticks back to the Exit1-IR state: Exit1-IR→Update-IR→Sel-DR-Scan→Sel-IR-Scan→Test-Logic-Reset. And so forth. Since the board test bus is de-coupled from the IC logic circuitry when the TAP Controller is in the Test-Logic-Reset state, this ensures that if the external test bus is disconnected, or if no active testing is being conducted even though the external test bus is connected, the system will be able to operate without being compromised by the presence of the test circuitry.

The effect of TDI stuck at high is to limit the instructions and signals shifted in to all ones. An all-ones signal is given special significance in IEEE Std 1149.1; read as an instruction, it is the BYPASS instruction. Consequently, the effect of an open TDI line, all else working, is to decouple the test bus from the on-chip logic.

Finally, the standard requires that if a TRST pin is provided at the TAP, and a corresponding line in the board test bus, that this also must be stuck-at-high in the absence of an incoming signal.

An implementation of the IEEE Std 1149.1 requirement regarding the stuck-at-high provision for TMS and TDI is depicted in FIG. 4, which shows a block diagram of the test circuitry on a standard-compliant board loaded with two standard-compliant chips; TMS and TDI are both linked to $V_{CC}$—the high-potential power rail for all the circuitry—by pull-up resistors A board test bus containing the four leads—TDI, TDO, TCK, TMS—is shown.

In addition to the provision for sending the TAP Controller to the Test-Logic-Reset state whenever TMS is left open or set at logic-high, IEEE Std 1149.1 requires that upon power-up the TAP Controller must be put automatically into the Test-Logic-Reset state. (This requirement is changed somewhat for those standard-compliant boards having the optional fifth lead in the TAP, TRST, with which the TAP Controllers can be put in the Test-Logic-Reset at any time, asynchronously.)

As shown in FIG. 4, each TAP Controller is multiply connected to its Instruction Register (which includes a shift register and a parallel output/latch register and associated Instruction Decoder), to its Data Registers, and to other components of the test circuitry on each chip. It is through these connections, and the control exercised over the TAP Controllers by TMS, that the external test controller determines into which register the incoming TDI signal—which will contain instructions as well as test stimulus information—is to be shifted at each step in the testing sequence. Through this means, the test input of the entire interconnected collection of chips on a board is coordinated; the TDI signal is shifted into the Boundary-Scan Register and the test data which enters the Boundary-Scan Register as the result of the voltage levels imposed on the pins later shifted out to the TDO line as a serial output to the external test bus for interpretation. (For on-chip-logic testing, one may think roughly of the TDI signal imposing a sequence of logic levels on the chip's input pins and the test data then appearing at the output pins, to be shifted onto TDO for analysis.)

The operation of the Boundary-Scan Test procedure of IEEE Std 1149.1 can be understood in more detail by continuing reference to FIGS. 1 through 4 and a review of the requirements of IEEE Std 1149.1 for the control outputs of the TAP Controller in its various states. Prior to the start of a board-testing sequence, all the TAP Controllers will be in the Test-Logic-Reset state, which is required to cause the test bus to be disconnected from the on-chip logic and from the pin interconnections. With the TAP Controllers in this state, all of the Boundary-Scan Cells will be transparent to operational signals (as opposed to test signals) flowing into and out of each chip. The initial signals on the external test bus will be the TCK pulse train—assumed to be present throughout all of the following discussion—and a logic-high TMS, to temporarily hold the TAP Controllers in the Test-Logic-Reset state, followed by a logic-low TMS to put the TAP Controllers into the Run-Test/Idle state, which resembles a staging position. With the TAP Controllers in Run-Test/Idle, the test circuit is still decoupled for the chips, but the TAP Controllers are set to receive either an Instruction-Register-Scan Sequence (IR-Scan)—which will shift in and assert an instruction—or a Data-Register-Scan Sequence (DR-Scan)—which will shift in and assert a test sequence in accord with the whatever instruction is then in effect. A test will normally commence with an IR-Scan. The Instruction Register is a compound device. It consists in part of a shift register (IR Shift Register) which can shift numbers in from TDI and out to TDO whenever it is in the TDI/TDO scan path, i.e., when its first stage has TDI as input and its last stage has TDO as output. That IR Shift Register is connected in parallel to a Parallel Output Register which serves to latch the number it receives from the IR Shift Register and present it for implementation to the IR Decoder, to which it is also connected in parallel. It is the IR Decoder which implements the instruction by sending control signals to various components of the test architecture, control signals which will determine the operating modes of the respective components. The IR Decoder will, for example, cause the Boundary-Scan Register to be placed into the TDI/TDO path when the requisite instruction has been scanned in and latched in the IR Parallel Output Register. (The instruction in the IR Parallel Output Register at any time is the "current instruction.") Also exercising control over the various components of the test architecture is the TAP Controller itself, as an explicit function of the state it is in.

Following is a list of the steps involved in an IR-Scan. The TMS values required by these steps can be inferred from FIG. 3. Recall that each TAP Controller and directly-associated circuitry controls the Boundary-Scan Cells on a single chip out of the several in the test Ring; TMS is connected in parallel to all of the TAP Controllers in the Ring and thus synchronizes what is happening on the various chips.

IR-Scan (a) Each TAP Controller is placed in the Select-IR-Scan state, which results in it placing its associated IR Shift Register into the TDI/TDO scan path;

(b) Each TAP Controller is next placed in the Capture-IR state, which causes the parallel transfer of the binary number "01" into the two least significant positions of the IR Shift Register. (This step is tied in with subsequently providing "reassurance" to the test controller that the test architecture on each chip is functioning properly.)

(c) Each TAP Controller is then placed in the Shift-IR state and left there for the number of TCK ticks necessary to shift into the Ring of IR Shift Registers the entire binary instruction concurrently being sent on TDI. (Note that this also will shift out to TDO—on the first two TCK pulses—the "01" stored in the LSB locations of each of the individual IR Shift Registers in the Ring.)

(d) Once the instruction has been shifted in, the TAP Controllers are moved to the Update-IR state which effects a parallel transfer of the number then in the IR Shift Registers to the IR Parallel Output Registers on the next falling edge of TCK. (Under IEEE Std 1149.1, all data coming into the chip—TDI, TMS chip inputs—are clocked in on the rising edge of TCK. All actions affecting the outputs are implemented on the falling edge. "Updating" a new instruction can have the effect of changing the chip outputs; therefore the IR Parallel Output Register is clocked on the falling edge.) This transfer, which is the last stage of the IR-Scan, will latch in a new "current instruction." "Updating" an instruction involves this transfer and consequent implementation of the instruction. The instruction is implemented by the IR Decoder which is connected in parallel to the IR Parallel Output Register and which then transmits control output signals which are commensurate with the current instruction.

(e) After being in the Update-IR for one tick on TCK, the TAP Controllers on all of the chips on the board under test will be sent to either Run-Test/Idle or to Select-DR-Scan, ending the IR-Scan.

It may be that there is provision on the chip for a Built-In Self-Test (BIST) that is independent of—or, better stated, parallel to—IEEE Std 1149.1 protocol. In that case, the first instruction shifted in and updated may be the standard-prescribed RUNBIST instruction, with the IR-Scan ending with the TAP Controllers in the Run-Test/Idle state, where they would be left while the BIST ran.

There is in IEEE Std 1149.1 provision for a chip identification scheme, wherein each chip will have a hardwired 32-bit Device ID Register. By causing the Device ID Register number to be switched out onto TDO, the test controller can interrogate the board so as to the devices (chips) present and then store complete information regarding devices on the board and the order in which they occur in the Test Ring. The instruction provided by the standard for the interrogation is IDCODE. When IDCODE becomes the current instruction, the Device Identification Register is placed in the TDI/TDO scan path.

Placing each TAP Controller back in its Test-Logic-Reset state causes the test circuitry to be disconnected from the chip logic circuitry. It also means that the control logic and Instruction Registers get reset, preventing further interconnect testing with that Test Ring.

System-Wide Testing

IEEE Std 1149.1 establishes an industry standard for Boundary-Scan testing of circuit modules, ensuring that manufacturers downstream from chip producers can load chips on a board in the knowledge that the completed board can be tested in a particular manner. Similarly, systems manufacturers downstream from suppliers of loaded standard-compliant boards can establish their own pre-assembly board tests with the knowledge that the anticipated board test bus will be present and interconnected to specific test circuitry on each chip.

Unfortunately, IEEE Std 1149.1 by itself does not provide for, or otherwise address, system-wide testing of an assembled multi-board system. Although a straightforward extension of the standard to system-wide testing can be imagined—that where a separate test bus is run from a central test controller to each board in the system (with appropriate multiplexing to keep the data exchange with each board coherent and separable)—the drawbacks of such a one-test-bus-per-board (actually one-test-bus-per-test-Ring) approach are equally obvious. They include such obstacles as excess cabling, repetitive hardware, and extremely complex data collection and analysis. Much the same may be said for an approach which daisy-chains together all of the boards—and all of the chips—in the system into one immense test Ring. The proliferation of test buses is avoided, but the complexity of the testing becomes truly overwhelming. Indeed, just the determination of the degree of testing completeness achieved by a particular test sequence is an imposing task. Finally, it seems likely that daisy-chain testing at the system-wide level would result in test hardware becoming quite dependent on the specific details of the system under test, a return to the circuit-dependent test set-ups which IEEE Std 1149.1 is intended to discourage.

Apart from the fundamental problems implicit in daisy-chaining all of the chips together into one immense Ring, there is the mundane but nevertheless serious impediment that arises from the fact that it is not really the boards that are being daisy-chained but rather the backplane slots that are to receive the boards as the system is assembled. This daisy-chaining of slots requires for its integrity that every slot wired into the chain be occupied; a vacant slot (e.g., an "expansion slot" in a Personal Computer) will disrupt the serially-connected test circuit.

The empty-slot problem is easy to overcome once the daisy-chaining of boards is abandoned in favor of a multi-drop arrangement, where the slots are connected in parallel to a single system test bus. One multi-drop scheme for system-wide testing system is incorporated in the developing IEEE P1149.5: "Standard Backplane Module Test and Maintenance (MTM) Bus Protocol." The architecturally-defined test and maintenance bus specified by IEEE P1149.5 would provide a link between a backplane test controller and individual test access ports associated with individual boards. The direction in which work on the evolving IEEE P1149.5 is proceeding appears to call for relatively complex backplane protocols which, while possibly justified in certain large-system contexts, appear to be impractical for small to medium-sized systems. Implementing such a standard will require hardware development and installation costs as well as significant software-creation expenditures.

A multi-drop scheme making use of and building on already-completed IEEE Std 1149.1 implementation work appears to have many advantages over any alternative approach, including that of IEEE P1149.5. Indeed, this philosophy has applicability to any module-based Boundary-Scan test scheme now in use or subsequently devised; the extension of such a scheme to test an extended system appears to be best done by building on the test architecture and protocol devised for the module level, extending it hierarchically in a manner discussed here specifically for the extension of IEEE Std 1149.1 to the system level.

Generalized Extension of IEEE Std 1149.1

The expansion of IEEE Std 1149.1 to a hierarchical multi-drop, system-wide scheme can be understood by reference to FIG. 5 and the following discussion, in which the test controller is now designated the Test Master and the system test bus the Backplane Test Bus.

FIG. 5 schematically depicts a backplane with n+1 slots, all of which are connected in parallel to a Backplane Test Bus conveying the four required IEEE Std 1149.1 leads (the optional TRST is not included in the figure)—and at least one of which is empty and one of which is occupied by a board bearing the Test Master. Two boards representative of those making up the system are shown in some detail. The entity labelled Backplane Test Bus Link on each of the representative boards is the collection of circuits serving to interface the Backplane Test Bus with the Local Bus containing the Test Ring of individual chips. The Backplane Test Bus Link is a standard-compliant IC (just as are the chips to be tested). As such, the Backplane Test Bus Link has a TAP, which is where the Backplane Test Bus couples in. Since all Backplane Test Bus Links will be connected in a similar fashion, the Test Master is able to broadcast test signals and instructions to those Links over the Backplane Test Bus. Each Backplane Test Bus Link contains, in addition to the entities required by IEEE Std 1149.1, the circuitry necessary to enable it to be selected for testing by the Test Master. It will also have to have the control means to synchronize the TAP Controllers on the individual chips to its own TAP Controller. FIG. 6a presents this schematically, with the Test Ring shown in some detail on one of the boards depicted.

The best way to utilize the standardization of the test architecture at the two levels (Backplane Test Bus Link and individual chip) appears to be to configure the test loop of the selected slot and Ring to include in the daisychain of TAPs that of the Backplane Test Bus Link itself, i.e., to put the Backplane Test Bus Link TAP on the Local Bus. This is what accounts for FIG. 5 showing TDO_lc to lead from the Backplane Test Bus Link to the first chip's TAP while TDI_lc leads to the Backplane Test Bus Link from the last chip's TAP. This is consistent with the usual IEEE Std 1149.1 terminology, where the TDO from one TAP goes into the TDI of the next TAP seriatim for a set of serially-connected/dasiy-chained TAPs.

Ideally, each Backplane Test Bus Link will also be able to coordinate all of the test Rings which may be on an individual board, thus eliminating the need for separate edge connector pins for each Ring and also introducing a degree of flexibility into the manner Rings may be combined for testing purposes.

The purpose of the Backplane Test Bus Link is to permit the Test Master—after a series of selection and interfacing instructions—to employ instructions and to exchange data with a particular IEEE Std 1149.1 test Ring as if the Test Master were a simple external test controller communicating with a single Ring on a single module. Furthermore, it is desired that the selection and interfacing instructions themselves be identical in form to Instruction and Data Scanning Sequences used under IEEE Std 1149.1. This is the reason for specifying that the Backplane Test Bus Link be a standard-compliant IC. It will contain a TAP Controller identical to the IEEE Std 1149.1 TAP Controller described earlier. In addition, it will contain circuitry permitting slot—and hence board—selection by the signals on the Backplane Test Bus, and Ring activation circuitry such that once the slot is selected all of the devices intermediary between the Test Master and the Local Ring become transparent.

FIG. 6 depicts in somewhat more detail the Backplane Test Bus Link which has been described above. It is seen to include a Backplane Test Bus Link Selection Controller tied to a source of information about the SLOT ID. (In this illustration, that information is shown as coming from a location off the board; it could also be positioned on the board.) Because of the parallel coupling of the individual Backplane Test Bus Links to the Backplane Test Bus, the Test Master broadcasts to all Backplane Test Bus Links at once. To initiate a test sequence, the Test Master needs to select a particular board. To do this it broadcasts an IR-Scan on TMS_bp and then, on TDI_bp, the ID number of the slot to be selected. If the two strings are equal, than that particular Backplane Test Bus Link is Selected; if not, it is disabled and its associated board isolated from the Backplane Test Bus. (The particular configuration shown in FIG. 6 is not meant to be limiting. Obviously, there are many ways to handle the addressing problem. The essential point is that there needs to be circuitry which can compare the address transmitted with the label on the particular slot or board and then enable the board in question to be coupled to the Backplane Test Bus for IEEE Std 1149.1 testing.)

After the selection process is completed, the Selected Backplane Test Bus Link, in response to signals from the Backplane Test Bus, then couples TDI_bp and TDO_bp, respectively, to TDO_lc and TDI_lc of the Board Test Bus for the circuit board in that slot. With continuing reference to FIG. 6, note the interposition between TDI_lc and TDO_bp of a tristate output buffer. This is essential since with multiple connections between TDI_lc and TDO_bp, the various TDI_lc signals would otherwise be in contention. Only for the Selected slot will this tristate output buffer be enabled to transmit signals from the Test Ring during subsequent shift operations.

Potentially, a given board containing standard-compliant ICs may be organized into several test Rings. In such a case a separate Backplane Test Bus Link may be provided for each Ring or, preferably, a single Backplane Test Bus Link may form the interface for all of the Rings, with separate Local Buses with lines TDI_Ic∅, TDI_Ic2, etc., TMS_Ic∅, TMS_Ic1, TMS_Ic2, etc., etc.

The only known prior-art implementation of the generalized IEEE Std 1149.1 scheme outlined above is described in

*An Architecture for Extending the IEEE Standard 1149.1 Test Access Port to System Backplanes*, by Dilip Bhavsar, Proceedings of the 1991 International Test Conference, October, 1991 ("Bhavsar-91"). In discussing Bhavsar-91 the nomenclature defined above shall be used except where noted.

For the Backplane Test Bus Link Selection Controller, Bhavsar-91 utilizes the three-state machine defined by the state diagram of FIG. 7. It is designated as the BT-Link Control Logic and operates in conjunction with the Backplane Test Bus Link TAP Controller. This BT-Link Control Logic starts out in the Wait state upon the system being powered up, or if the Backplane Test Bus Link TAP Controller in the Test-Logic-Reset state (which will generally be the case upon power-up), or if the optional TRST line is present and an asynchronous reset signal has been sent. From that Wait state, the BT-Link Control Logic will go to the Selected state if the number shifted into the Backplane Test Bus Link IR is equal to the SLOT-ID (ADDR=SLOT-ID) and the Backplane Test Bus Link TAP Controller passes through its Update-IR state. The BT-Link Control Logic will be sent back to the Wait state if and only if the Backplane Test Bus Link TAP Controller is put in the Test-Logic-Reset state; the change will occur upon the next positive edge on TCK following the Backplane Test Bus Link TAP Controller going to that state. (It will also go to the Wait state for either of the other two conditions displayed in FIG. 7.)

Conversely, the BT-Link Control Logic will go to the UnSelected state from the Wait state if the number shifted into the Backplane Test Bus Link IR is not equal to the SLOT-ID (ADDR≠SLOT-ID) and the Backplane Test Bus Link TAP Controller passes through the Update-IR state. It will remain UnSelected until the Backplane Test Bus Link TAP Controller is again placed in the Test-Logic-Reset state, when it will return to the Wait state.

The significance of the Wait state is that with the BT-Link Control Logic in that state, the associated Backplane Test Bus Link is waiting for an address. Any instruction transmitted on the TDI line of the Backplane Test Bus will be viewed as an address to be compared with the SLOT-ID as long at the BT-Link Control Logic is in the Wait state.

In addition to introducing a means to select a particular Backplane Test Bus Link for testing, Bhavsar-91 defines an instruction repertoire that enables control of the Local Chip TAP Controllers by the Backplane Test Bus Link TAP Controller (which in turn is under the control of the Test Master). Among these instructions, shifted into the Backplane Test Bus Link Instruction Register after the particular slot has been Selected, is ON_LOCAL. This instruction causes the Backplane Test Bus Link to couple TMS_bp to TMS_lc. The Backplane Test Bus Link TAP Controller and the Local Chip TAP Controllers are synchronized by being placed in the Run-Test-Idle state immediately after the ON_LOCAL instruction is updated. This places all of the TAP Controllers in the same state so that subsequently, with TMS_bp received by the Backplane Test Bus Link TAP Controller being the same as TMS_lc to the Local Chip TAP Controllers, those TAP Controllers remain synchronized, i.e., pass through the same sequence of states. I.e., after synchronization, the Backplane Test Bus Link TAP Controller and the Local Chip TAP Controllers are sequenced as one, and normal IEEE Std 1149.1 operations may commence. The inverse instruction of Bhavsar-91 is OFF_LOCAL. When this instruction is updated, the Backplane Test Bus Link takes control of TMS_lc, decoupling it from TMS_bp and forcing it high. All the Local Chip TAP Controllers of the Local Ring which had been under test then return to the Test-Logic-Reset state and remain de-coupled from the Backplane Test Bus. This method of de-coupling the Backplane Test Bus from the Test Ring under test resets the controls on the Boundary-Scan Register of the Test Ring and thus makes inaccessible for any later testing the information which had been shifted into the Boundary-Scan Register while the Ring was on a Selected module. This de-selection process of Bhavsar-91—a step necessary before another slot can be selected for testing—seriously limits that prior-art test architecture when true system-wide testing is desired. The reset restriction means that:

(1) Backplane interconnect testing cannot be performed, since the backplane drivers of two modules cannot be controlled simultaneously;

(2) The Backplane Test Bus Link cannot be used to start autonomous test functions—such as a Built-In Self Test (BIST)—and then proceed to perform other test functions on other modules or local rings;

(3) Any action where two or more boards must be enabled is virtually impossible—for example, the scheme cannot be used to perform a system-wide SAMPLE operation.

Other disadvantages of Bhavsar-91 can be seen in its handling of Local TAP enabling and disabling. Although Bhavsar-91 mentions the possibility of having its Backplane Test Bus Link concurrently service several local ports (with a Test Ring of daisy-chained chips coupled to each) on a single selected board—it does not address the complications of configuring and synchronizing more than one local Test Ring simultaneously.

Therefore, what is needed is true system-wide test architecture able to make use of previously-implemented module-level test schemes. Ideally, such test architecture will make possible system-level testing which is in all qualitative respects identical to that used in the previously-implemented module-level tests underlying the enhancement. Also needed is a unified method of activating for such testing multiple Test Rings on a single board. In particular, what is needed is a means of configuring some or all of such Test Rings for testing as a unit. The present invention meets all of these needs and hence makes possible complete system-wide testing which builds on and can incorporate work already performed in implementing a module-level test scheme.

SUMMARY OF INVENTION

This Invention encompasses apparatus and protocol for fault-testing electronic logic circuits made up of a multitude of individual modules, each of which is compliant with a certain Boundary-Scan test standard. It introduces a hierarchy of levels of standard-compliant ICs and associated test buses configured so as to ensure that, during testing, a central test controller ("TEST MASTER") is communicating directly with a ring of chips under test and that all of the circuitry intermediate between the TEST MASTER and the chips under test becomes transparent to the TEST MASTER and to the chips. The hierarchy of levels is further configured so that the test environment emulates that of a simple external test bus coupled to an individual standard-compliant module. The Invention achieves this object and also that of permitting any particular standard-compliant Ring in the system or any combination of such Rings on a given module to be tested from a central TEST MASTER in accordance with the test protocol of a module-level Boundary-Scan Test standard, by optimizing the advantages presented by the similarities among the corresponding test architecture at the different hierarchical levels.

In the preferred Embodiment of this Invention, IEEE Std 1149.1 is the referent for "standard-compliant." For clarity and definitiveness, the remainder of this SUMMARY will be phrased in terms of this Boundary-Scan testing standard; however, the present Invention is not limited in application to IEEE Std 1149.1, but provides for the system-wide extension of many types of test protocols developed for testing of individual modules.

The Preferred Embodiment provides for a TEST MASTER to broadcast to a collection of SLOT Links connected in parallel to a Backplane Test Bus embracing TDI, TDO, TMS, TCK, and optionally TRST, lines. (As will be seen, the SLOT Link of the present invention is not the exact counterpart of the Backplane Test Bus Link described in the discussion of the prior art.) Each SLOT Link, being a standard-compliant IC, contains a TAP, a TAP Controller, an Instruction Register, and Data Registers. It also contains a means by which it (the SLOT Link) can be selected—a Selection Controller—and contains or has associated with it a hard-wired ID, the SLOT-ID. To differentiate these elements from similar ones at different levels, they will be designated as: SLOT Link TAP, SLOT Link TAP Controller, SLOT Link Selection Controller, etc.

A distinguishing feature of the present Invention is the design of the SLOT Link Selection Controller which, in contrast to the prior art performing the selection function, allows a previously-selected SLOT Link (and hence associated module) to be de-selected without any resetting of Test Ring Boundary-Scan Cells. This is necessary if any interconnect tests are to be carried out between modules, i.e., if true system-wide testing is to be implemented.

Another distinction from the prior art is the separate Ring Controller provided by the present Invention for the activation and parking each of the Test Rings. Each Ring Controller is part of a separate Local Serial Port architecture forming an interface between the SLOT Link and a particular Local Test Ring. Analogous to the manner in which the TEST MASTER communicates with the SLOT Links, each SLOT Link communicates to and controls a group of Local Serial Ports (LSPs). The LSPs themselves are not standard-compliant ICs but form a control layer between the SLOT Link and the collection of standard-compliant chips on the Test Ring coupled to an LSP TAP. Each LSP contains an LSP Ring Controller for activating and controlling the Test Ring connected to the associated LSP TAP. This LSP Ring Controller is an important aspect of the present Invention, in that it is this which allows a Test Ring of chips to be left "parked" in a particular state when that Ring is decoupled from the external test control signals. This capability couples with the flexibility of the new SLOT Link Selection Controller to permit particular Boundary-Scan Register patterns placed on a Ring under test to be left in place, with a commensurate pattern of logic values on the external pins of the chips in that Ring, as the related SLOT Link is deselected. This means that when the TEST MASTER goes on to examine another Ring on another module it can check the logic pattern received on the new Ring from the chips left "parked."

Each Ring on a module is connected to a separate LSP TAP. For modules with more than one ring, the present Invention provides—either through more complex hardware or through a more complex LSP Ring Controller instruction repertoire—for several Rings on a board to be series-coupled into an Extended Test Ring which is then subject to ordinary IEEE Std 1149.1 testing. This aspect of the present Invention allows n Rings on a board to be so coupled into any of their $2^n$ possible Extended Test Rings.

Although for purposes of understanding the test circuit of the present Invention it is useful to think of several levels of signals—those on the Back-plane Test Bus to the SLOT Links, those between an individual SLOT Link and its associated LSPs, and those on the Local Test Bus to individual chips—the communication ultimately is between the TEST MASTER and the individual chips. The controllers at each level are slaved to controllers at a higher level and thus all ultimately under the control of the TEST MASTER.

NOMENCLATURE

Chip Level: The lowest level in the hierarchy is that of the individual standard-compliant chip, with Chip TAP, Chip TAP Controller, Chip Instruction Register, Chip Boundary Scan Register and other Chip Data Registers, etc. The Chip TAPs are daisy-chained together by a Local Test Bus {containing the lines TDI_lc, TDO_lc, TMS_lc, TCK_lc, and possibly TRST_lc} which connects directly to an LSP TAP addressed by that module's SLOT Link. Where there is more than a single Ring on a module, the designations TDI_lc∅, TDI_lc1, TDI_lc2, TDO_lc∅, TDO_lc1, TDO_lc2, etc. will be used for the lines of the different Local Test Buses.

SLOT Link Level: The highest level of hardware in the Invention, excluding the Backplane Test Bus itself, is the SLOT Link, which contains a SLOT Link TAP (a port with pins for connecting to TMS_bp, TCK_bp, TDI_bp, TDI_bp, and possibly TRST_bp, the lines of the Backplane Test Bus), a SLOT Link TAP Controller, a SLOT Link Selection Controller, a SLOT Link Instruction Register (with Parallel Output Register and Decoder), and possibly a switching means to configure the connections between the SLOT Link and the several LSP TAPs and hence to configure the LSPs and their associated Test Rings. (Depending on the particular embodiment of the Invention, the mechanism of configuring the LSP TAPs will be placed either within the SLOT Link or at the LSP level. In the latter case, it will be in the form of an extended instruction repertoire.)

The SLOT Link Selection Controller is a three-state machine superficially similar to the BT-Link Control Logic machine of Bhavsar-91, but possessing an instruction repertoire permitting its SLOT Link to be deselected without forcing a reset on the Local TAP Controllers.

LSP Level: This is an intermediate level in the hardware hierarchy. It is the level of the LSP Ring Controllers which activate (unpark) and then synchronize the Local Test Rings in response to instructions from the TEST MASTER via the SLOT Link. It is to the LSP TAPs (the Ring Ports) that the local test buses—{TDI_lc∅, TDO_lc∅, TMS_lc∅, TCK_lc∅, TRST_lc∅}, {TDI_lc1, TDO_lc1, TMS_lc1, TCK_lc1, TRST_lc1}, etc.—are connected. In the Preferred Embodiment, each LSP Ring Controller is a four-state machine with states permitting it—in response to instructions shifted into the SLOT Link IR—to unpark an individual Ring and later to repark it after a specified logic pattern in the Boundary-Scan Register has been "set" by the TEST MASTER.

General Terms: Names of states of finite state machines involved in the Invention and in the prior art will be bold, e.g., Wait. Instruction labels will be underlined, e.g, Go_to_Wait.

PREFERRED EMBODIMENT OF THE INVENTION

The circuitry associated with this Invention can be physically located anywhere. Although the chips in a particular Ring are on a particular module, the rest of the circuitry associated with that module may be mounted anywhere. In the Preferred Embodiment, it is located physically on the module itself and coupled to the Backplane Test Bus by means of the module's edge connector pins. In particular, the SLOT Link—including the SLOT-ID, which contains and conveys a hardwired six-digit binary number—is located on each board, leaving nothing of the Invention on the backplane but the Backplane Test Bus. Under certain circumstances, it may be desirable to go to the opposite extreme and mount everything on the backplane, a choice that would shift test apparatus control to the system designer/assemblers from the board designer/assembler. It would also make the slot, rather than the board, the entity being selected. This can also be accomplished with a configuration which places the SLOT-ID on the backplane, but the rest of the. SLOT Link and LSPs on the board. It can be seen also that much or all of the test circuitry (apart from the local buses and chips) can be placed on a separate test-module which is insertable into a backplane slot just like the modules of the system to be tested. Yet another arrangement would be to have several SLOT Links on a single board, with one or more test rings connected to each, or even to have the associated SLOT Link TAPs on a single board connected in parallel in a "tree" structure. The point is that within the Invention there are many physical arrangements of the apparatus which may prove useful; the Preferred Embodiment sets out only one of these.

SLOT Link Selection Controller

Figure 8:
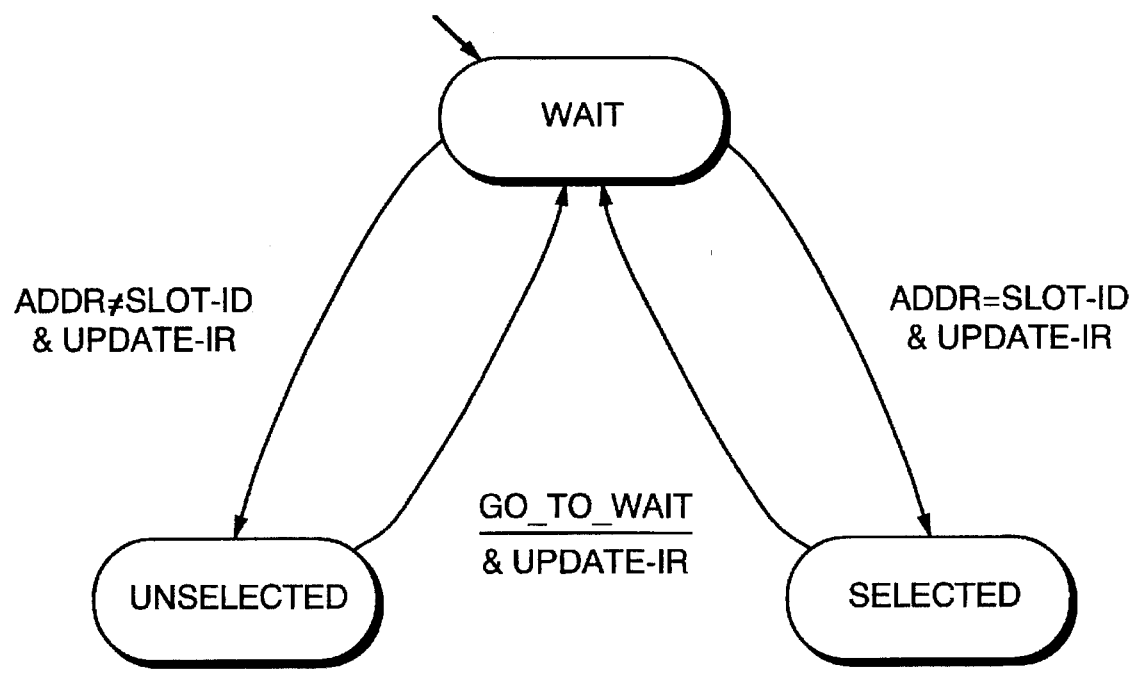
FIG. 8 sets out the state diagram for the three-state finite state machine serving as the SLOT Link Selection Controller in the Preferred Embodiment of the present invention.

The primary mechanism for allowing IEEE Std 1149.1 protocol to be used on the Backplane Test Bus is the SLOT Link, and, more particularly, the SLOT Link Selection Controller, which operates in parallel with the SLOT Link TAP Controller. The SLOT Link Selection Controller of the Preferred Embodiment is a three-state machine which, except for a fundamental innovation in the instruction repertoire, is similar to the prior-art BT-Link Control Logic of Bhavsar-91. As shown in FIG. 8, the three states themselves—Wait, Selected, and UnSelected—are the same as those of the Bhavsar-91 machine. The ability of the SLOT Link Selection Controller to return to the Wait state in response to a new Go-To-Wait instruction is a key innovation, since this means that the machine can leave the Selected state (and ultimately go to the UnSelected state) without resetting the Chip Tap Controllers. This Go_TO_Wait instruction used with the SLOT Link Selection Controller represents a fundamental change from the prior-art device. It is this instruction—and provision for it—which makes it possible to test the interconnections between modules in the system, and other operations which require specific settings on more than a single board simultaneously. It permits another module to be selected without the Chip TAP Controllers on the initial board being reset, as would be the case with the SLOT Link TAP Controller being sent to the Test-Logic-Reset state.

As before, operation of the SLOT Link Selection Controller is synchronized to TCK_bp, with changes of state occurring on a rising edge of TCK_bp when the SLOT Link TAP Controller is in the Update-IR state. The three states of the SLOT Link Selection Controller can be characterized as follows:

Wait State

Figure 1:
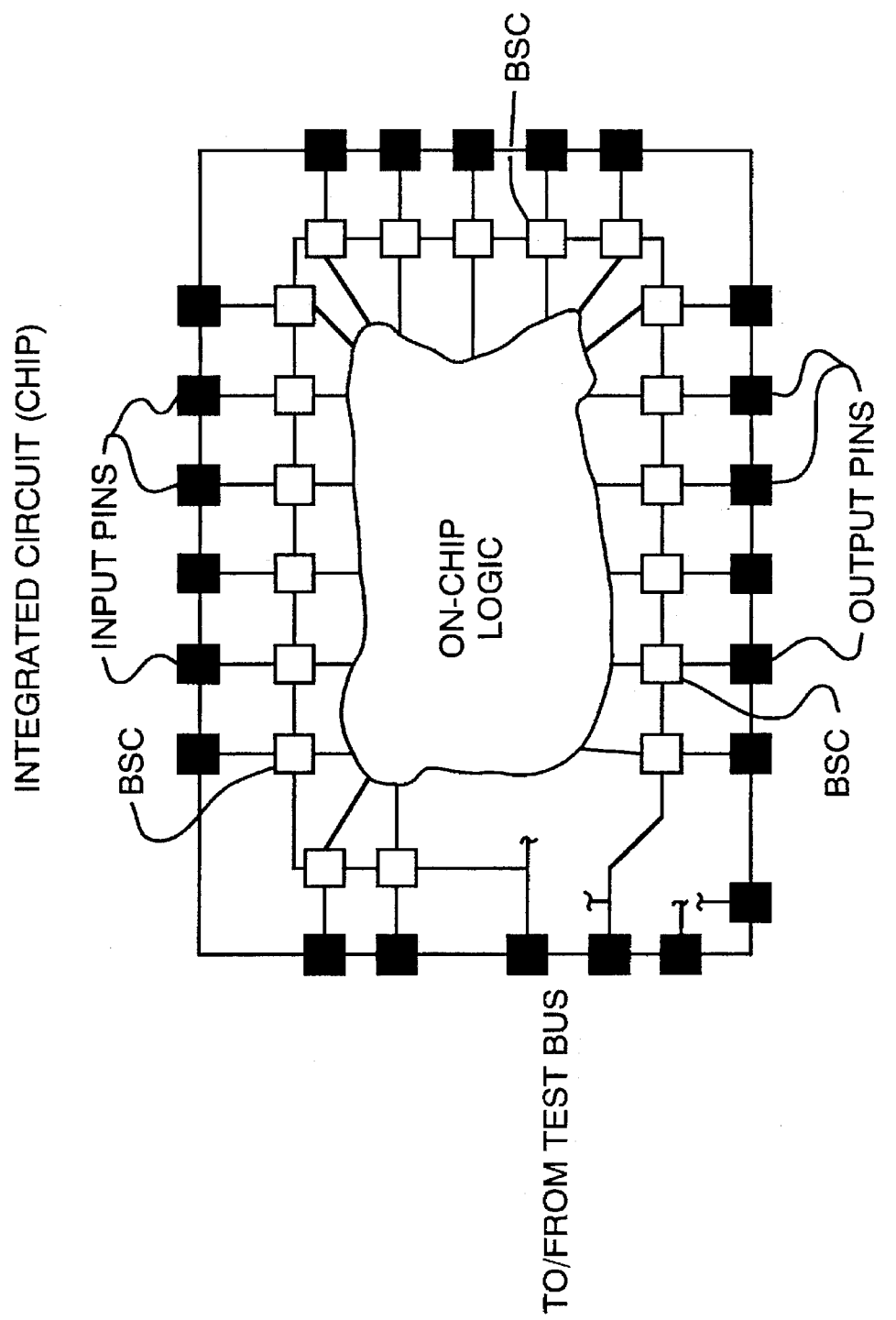
FIG. 1 an illustration of basic boundary-scan testing architecture. (Prior Art)
Figure 2:
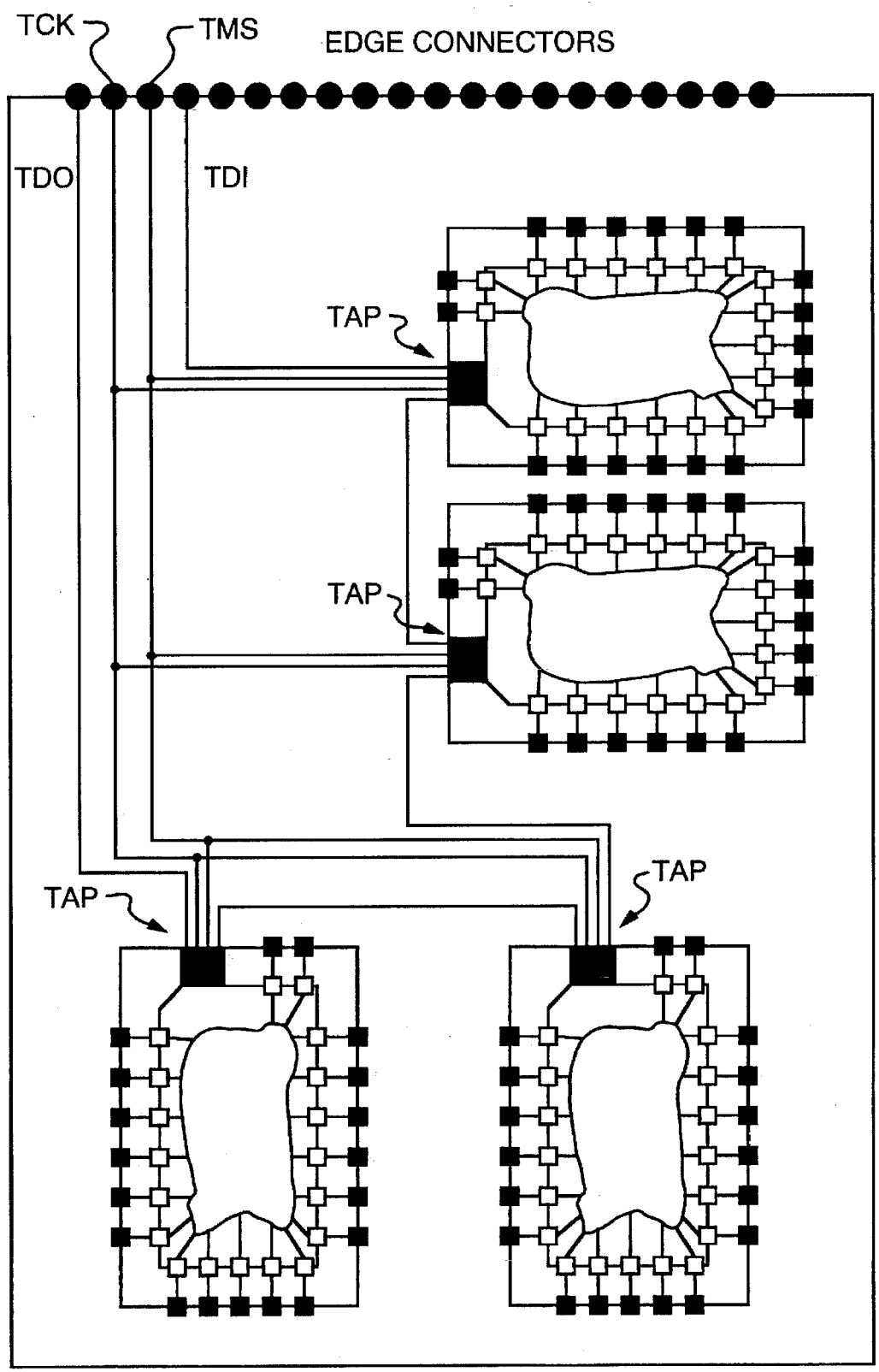
FIG. 2 is an illustration of how chips are daisy-chained together for boundary-scan testing with IEEE Std 1149.1, showing the lines of the local test bus, such as TDI, etc. (Prior Art)
Figure 3:
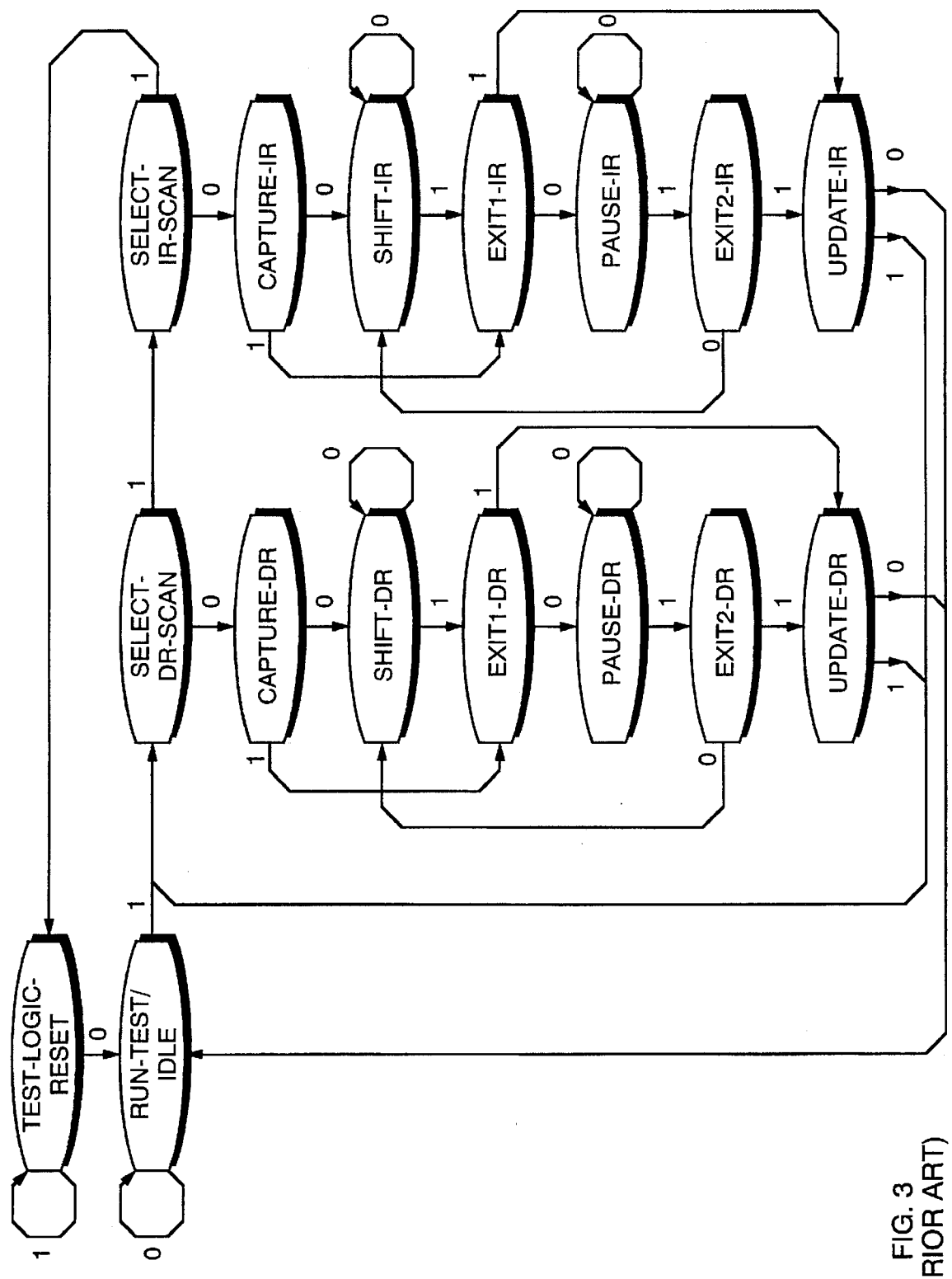
FIG. 3 is, the IEEE 1149.1 TAP Controller state diagram. (Prior Art)
Figure 4:
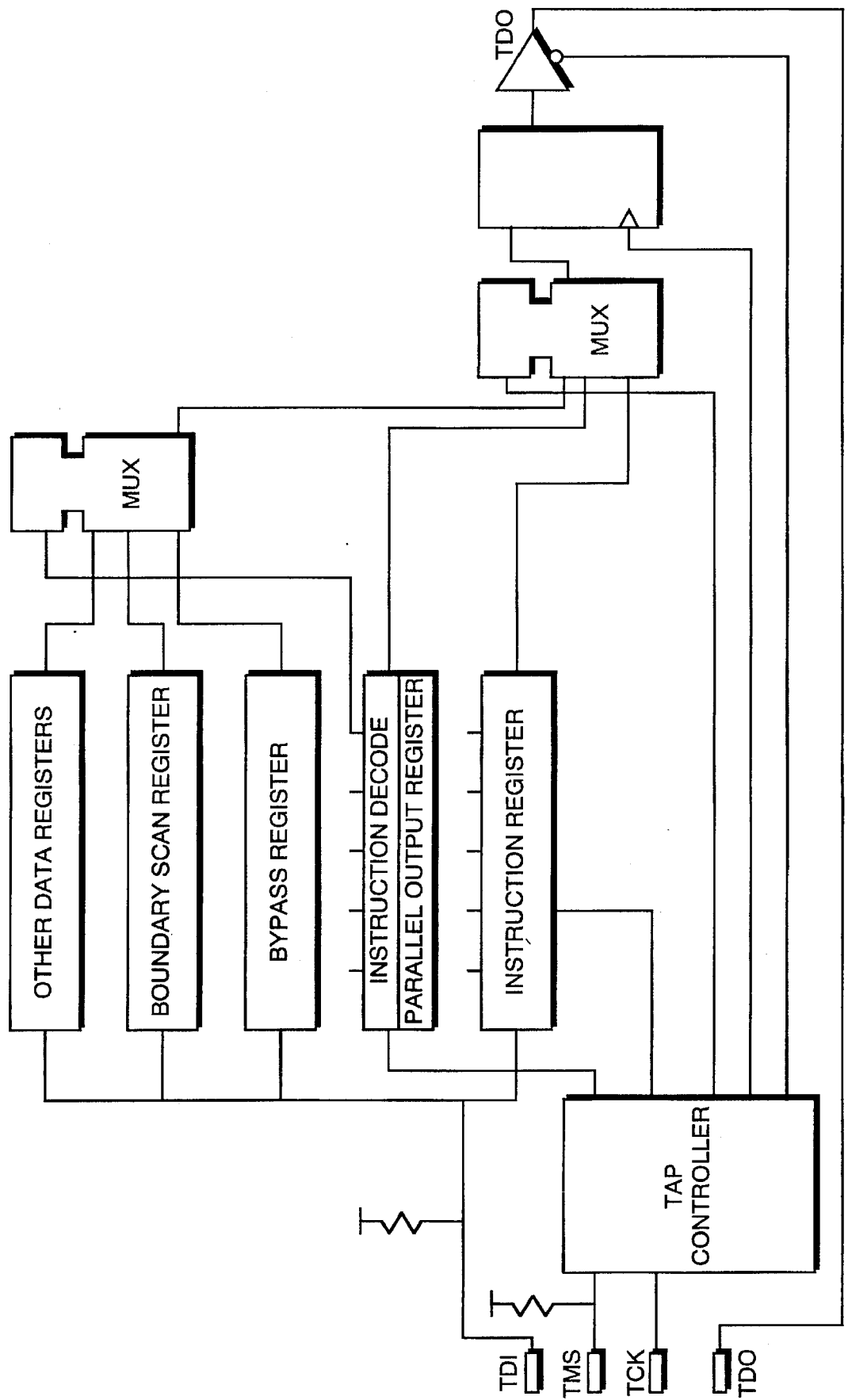
FIG. 4 shows a schematic layout of the IEEE Std 1149.1 test architecture on a single chip an how it couples to an external test bus. (Prior Art)
Figure 5:
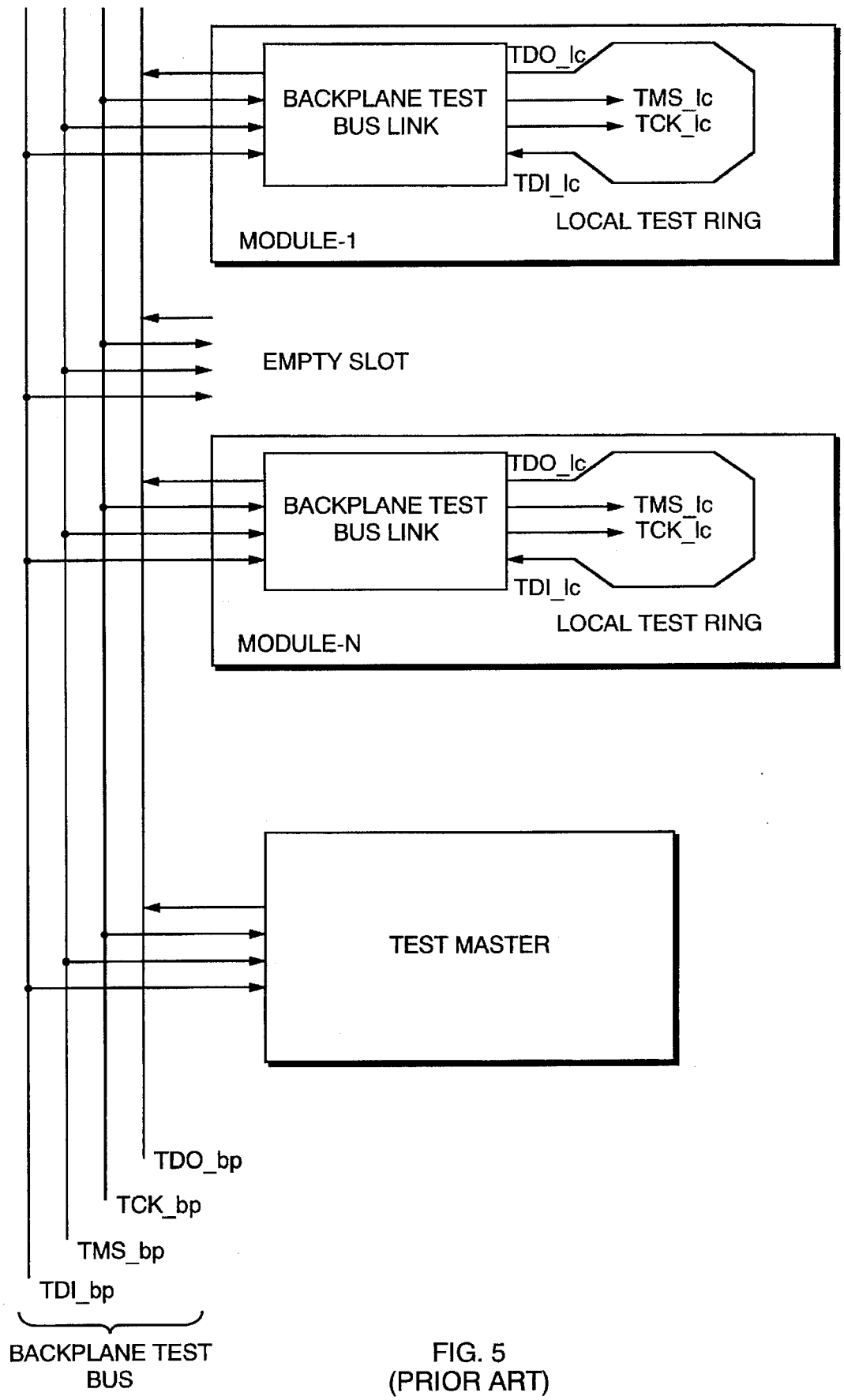
FIG. 5 shows the formal expansion of IEEE Std 1149.1 to a multi-drop circuit, depicting a system in which one slot is unoccupied and the others have a Backplane Test Bus Link interface between the system test bus and a local IEEE-Std-1149.1 compliant Test Ring. (Prior Art)
Figure 6:
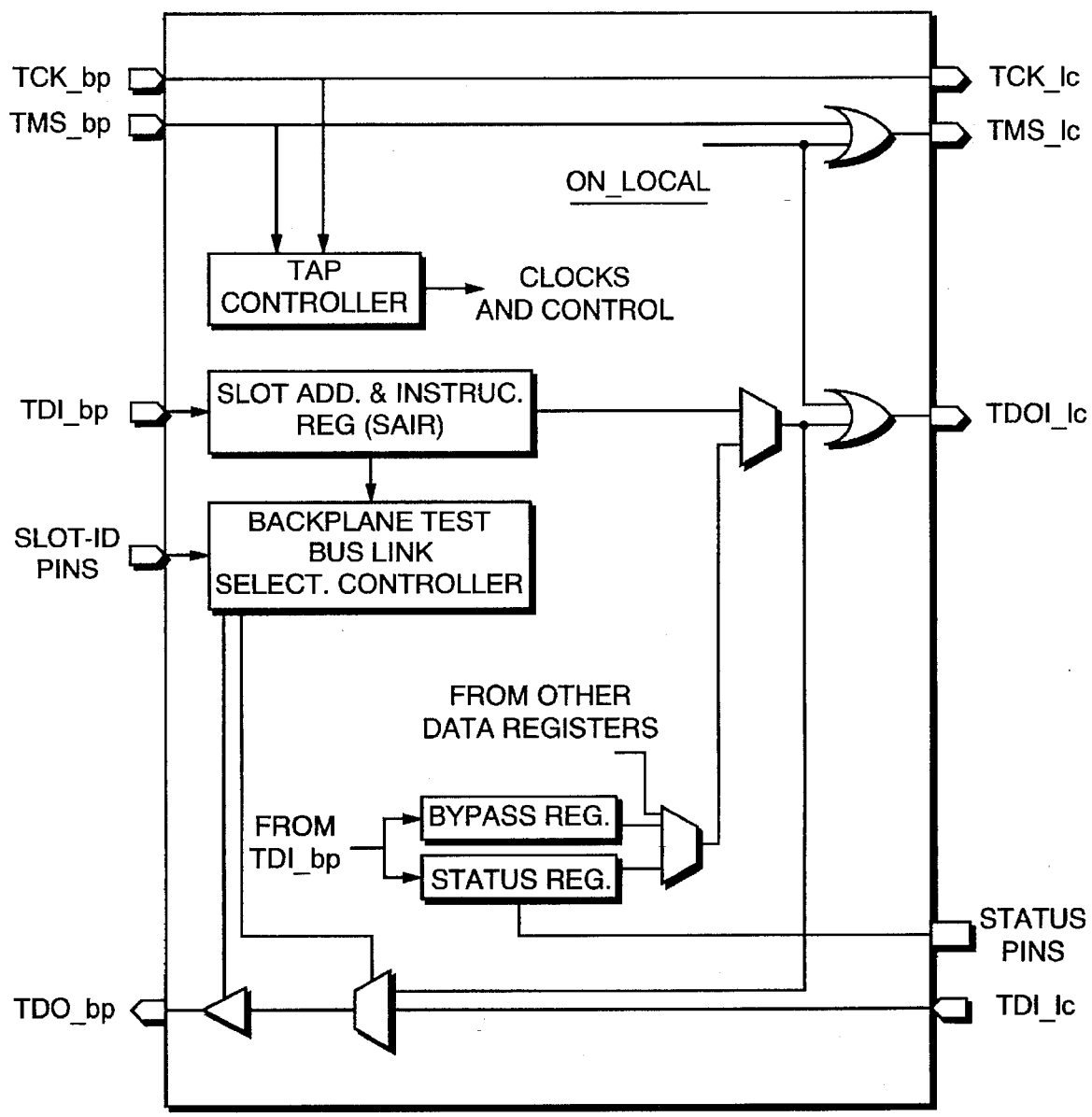
FIG. 6 provides more detail of the generic Backplane Test Bus Link and associated circuits suggested schematically in FIG. 5. (Prior Art)
Figure 7:
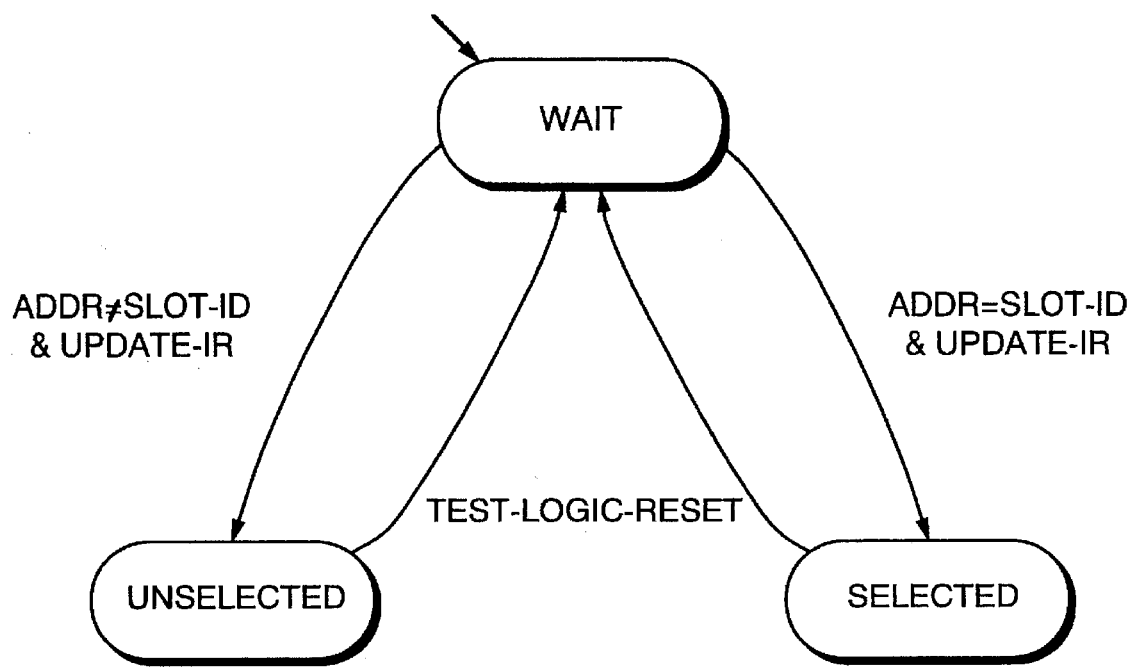
FIG. 7 sets out the state diagram for the prior-art three-state finite state machine used for selecting slots to be tested under an expanded IEEE Std 1149.1. (Prior Art)

The SLOT Link Selection Controller enters the Wait state upon power-up of the system (or if the optional TRST signal is asserted or if the SLOT Link TAP Controller—a sixteen-state machine with state sequence diagram defined in FIG. 3—is put into the Test-Logic-Reset state). While the SLOT Link Selection Controller is in the Wait state—or, more briefly stated, when the SLOT Link is in the Wait state—the SLOT Link is expecting a slot address from the Backplane Test Bus. While the SLOT Link Selection Controller is in the Wait state, all incoming data on TDI_bp will be treated as an address and shifted into the SLOT Link's Instruction Register for comparison with the hard-wired SLOT-ID for that particular board. When the SLOT Link TAP Controller enters the Update-IR state—or, more colloquially, when the SLOT Link enters the Update-IR state—the SLOT Link Selection Controller compares the address in the Instruction Register with the number presented by the hard-wired SLOT-ID pins.

The SLOT Link Selection Controller in the Wait state causes the tristate output buffer leading to TDO_bp to be disabled (i.e., in its inactive, high-Z state), blocking the TDI_lc output from the Local Test Bus to the Backplane Test Bus. If instead of an IR-Scan, a DR-Scan sequence is performed first, the Device ID Register is placed in the TDI_bp/TDO_bp scan path by the SLOT Link TAP Controller. (Of course, without the SLOT Link having been selected the TDO driver is inactive—"tristated"—and so even though the ID Register is in the scan path, its value cannot be shifted out.)

Selected State

The SLOT Link Selection Controller enters the Selected state from the Wait state if the address in the SLOT Link Instruction Register—i.e., the number in the SLOT Link IR Parallel Output Register, the "current instruction"—matches the SLOT-ID code. The SLOT Link Selection Controller in the Selected state enables local operations to be performed. Furthermore, updates to the SLOT Link Instruction Register are no longer inhibited. The same is true of the TDO_bp output buffer. With the SLOT Link Selection Controller in the Selected state the TDO_bp output buffer is enabled whenever the SLOT Link TAP Controller is in the Shift-DR or the Shift-IR state. Immediately after the SLOT Link enters the Selected state, the IDCODE instruction may be loaded into the SLOT Link Instruction Register. (This is useful because if normal IEEE Std 1149.1 operations are to begin immediately after selection is made, it is important to know what the behavior of the module will be. With the IDCODE instruction loaded, that information is made available.)

UnSelected State

The SLOT Link Selection Controller enters the UnSelected state from the Wait state if the address in the SLOT Link IR Parallel Output Register does not match the SLOT-ID Code. During the period that the SLOT Link Selection Controller is in the UnSelected state, local operations are disabled and SLOT Link IR updates, i.e., transfers to the SLOT Link IR Parallel Output Register, prevented. Furthermore, the TDO output buffer is disabled regardless of the SLOT Link TAP Controller state. If a DR-Scan is transmitted on the Backplane Test Bus while the SLOT Link Selection Controller is in this state, the SLOT Link ID Register is placed in the TDI_bp/TDO_bp scan path.

LSP Ring Controller

Once a particular slot has been selected as set out above, a further selection process is needed, that of the Local Ring or Rings to be tested. Within the present Invention, there are various methods of choosing particular Rings for activation; that of the Preferred Embodiment will be set out below. Whatever method is used, each Ring selected will be activated and de-activated by the LSP Ring Controller associated with it: one LSP Ring Controller per Ring. The instructions sent to the LSP Ring Controller must ensure that the Chip TAP Controllers in the associated Ring are in the same state as the SLOT Link TAP Controller during the period of testing. The Chip TAP Controllers in a particular Test Ring are synchronized with the SLOT Link TAP Controller by means of the LSP Ring Controller associated with that Test Ring.

In the interest of clarity, the initial case considered will be one with just a single Test Ring on the module. Once the SLOT Link is Selected (i.e., once the SLOT Link Selection Controller is in the Selected State), this Ring can be accessed and synchronized; this is done in response to instructions sent by the Test Master to the selected SLOT Link. (Strictly speaking, the instructions in question will be broadcast to all of the SLOT Links on the Backplane Test Bus. However, all but the selected SLOT Link are blocked from implementing the Update-IR instruction of the IR-Scan sequence.) Once the Chip TAP Controllers and the SLOT Link TAP Controller are in the same state and TMS_bp coupled directly to TMS_lc (which is the essence of activating and synchronizing the local Test Ring), the SLOT Link TAP Controller and all of the Chip TAP Controllers appear to the Backplane Test Bus to be all part of a single daisy-chain. From this point on the TEST MASTER can exchange instructions and data directly with this local Test Ring just as if it were a simple external test bus connected to an isolated IEEE Std 1149.1 Ring.

Figure 9:
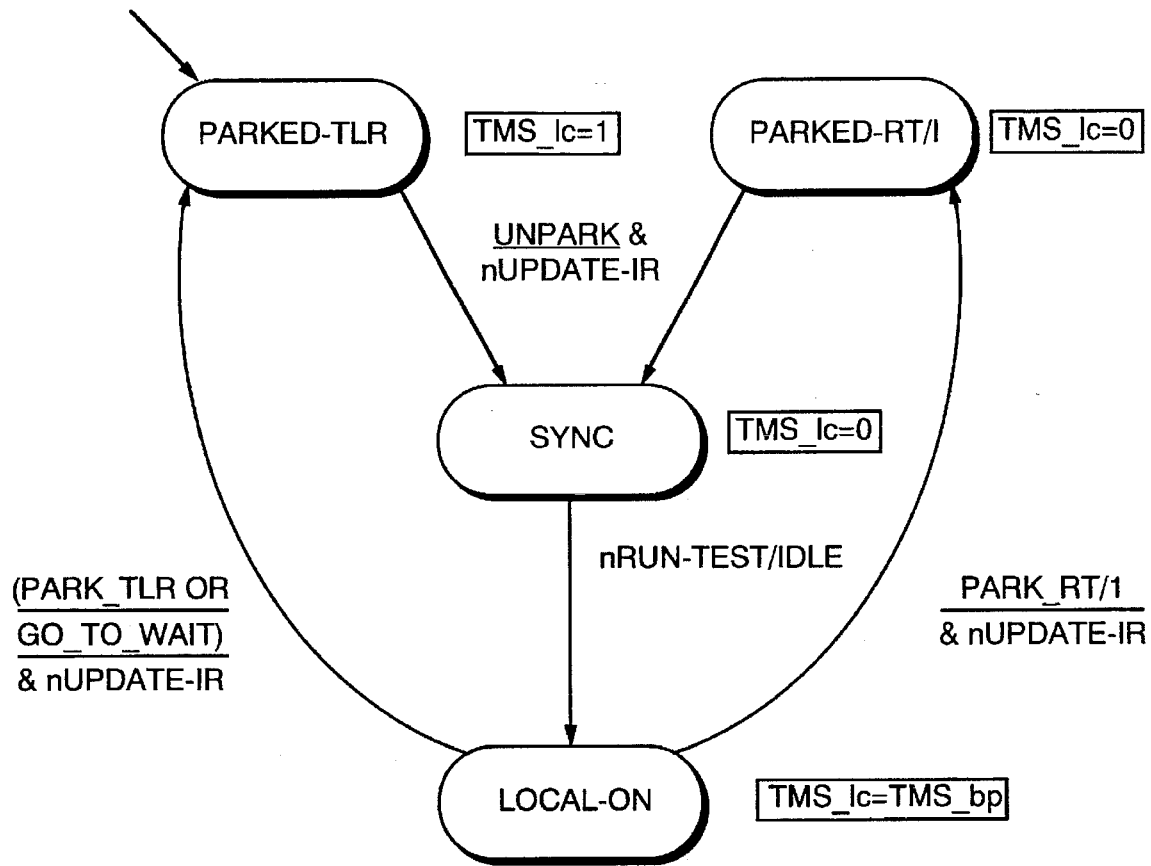
FIG. 9 sets out the state diagram for the four-state finite state machine serving as the LSP Ring Controller in the Preferred Embodiment of the present invention.

In the Preferred Embodiment, the LSP Ring Controller is a four-state machine with state sequencing as defined in FIG. 9. As with the rest of this test circuitry, its transitions are clocked by TCK_bp. In FIG. 9, conditions precedent for specific state transitions are shown by the unboxed text next to the transition arrows. The commands ("output variables") asserted by the LSP Ring Controller in the respective states are shown as boxed text next to each of the four states. The following describes the behavior of an LSP Ring Controller for the various states and its transitions among these states.

Parked-TLR State

The LSP Ring Controller is made to enter this state (a) upon power-up, (b) by assertion of the reset signal on the optional TRST line, or (c) if the next state of the SLOT Link TAP Controller is Test-Logic-Reset. Many of the important transitions of the LSP Ring Controller involve as a condition precedent not the state of the SLOT Link TAP Controller, but what its next state is to be. Next-state conditions can be acted upon because the control signal—i.e., the logic level of TMS_bp—which will cause a state change of the SLOT Link TAP Controller will be in the circuit for a period of time before being acted upon (for example, because the next rising edge of TCK_bp has not yet arrived, even though the required logic level of TMS_bp has been set). As will become evident later, this is necessary so that the correct timing of TMS_lc will be maintained.

While in the Parked-TLR state, an LSP Ring Controller forces TMS_lc to be logic-high, thus driving the Chip TAP Controllers in the associated Test Ring to the Test-Logic-Reset state and holding them there.

The LSP Ring Controller also will enter the Parked-TLR state from the Local-On state if it receives the Park-TLR instruction or the Go-To-Wait instruction when the next state of the SLOT Link TAP Controller is going to be Update-IR. The provision for the LSP Ring Controller to return to the Parked-TLR state under a Go-To-Wait instruction allows for the possibility of the local Ring not being unparked by the TEST MASTER before the TEST MASTER de-selects the SLOT Link (Go-To-Wait being a de-select instruction for the SLOT Link Selection Controller—see FIG. 8. I.e., Go-To-Wait is an instruction shared by the SLOT Link Selection Controller and the LSP Ring Controller).

Parked-RT/I State

The LSP Ring Controller enters this state from the Local-On state upon receiving the Park-RT/I instruction when the next state of the SLOT Link TAP Controller is going to be Update-IR. In this state, the LSP Ring Controller forces TMS_lc to logic-low, thus keeping the Chip TAP Controllers parked in the Run-Test/Idle state.

Sync State

The LSP Ring Controller is put in this state to provide for the delay necessary for synchronization of the SLOT Link TAP Controller and the Chip TAP Controllers in the Test Ring (and, when necessary, for the synchronization of several Rings with one another). While in this state, the LSP Ring Controller impresses a logic-low signal on TMS_lc, keeping the Chip TAP Controllers in the Run-Test/Idle state until the synchronization takes place—when the SLOT Link TAP Controller enters the Run-Test/Idle state (see below). The LSP Ring Controller enters the Sync state from either of the parked states (Parked-TLR or Parked-RT/I) upon receiving the UnPark instruction, provided that the next SLOT Link TAP Controller state is going to be Update-IR.

Local-On State

The LSP Ring Controller enters the Local-On state from the Sync state if the next state of the SLOT Link TAP Controller is going to be Run-Test/Idle, an indication that synchronization has been achieved. In the Local-On state, the LSP Ring Controller relinquishes control over TMS_lc to TMS_bp, i.e., to the TEST MASTER. (Thus, TMS_lc equals TMS_bp while the LSP Ring Controller is in the Local-On state.)

The basic operation is as follows. When a Local Ring is not being accessed, its Chip TAP Controllers are "parked" in one of two states: Test-Logic-Reset or Run-Test/Idle. The LSP Ring Controller is able to park the Local Ring by controlling TMS_lc. TMS_lc is forced high in order to park the individual Chip TAP Controllers in the Test-Logic-Reset state and forced low in order to park them in the Run-Test/Idle state. The TEST MASTER achieves Local Ring access by issuing the UnPark instruction. Upon receiving this instruction, the LSP Ring Controller enters its Sync state, where it remains until the SLOT Link TAP Controller is sequenced (by TMS_bp) to the Run-Test/Idle state. Since the Chip TAP Controllers of the unparked Ring are already in the Run-Test/Idle state, this is the event which signals synchronization between the selected SLOT Link TAP Controller and the Chip TAP Controllers, and to which the LSP Ring Controller responds by automatically entering the Local-On state. (I.e., in the Preferred Embodiment, synchronization occurs and IEEE 1149.1 testing commences when the SLOT Link TAP Controller and the Chip TAP Controllers "intersect" in the Run-Test/Idle state.) From this point on, until a certain interrupt is imposed, the Chip TAP Controllers are synchronized to the SLOT Link TAP Controller and normal TAP Controller sequencing by the TEST MASTER can proceed in normal IEEE Std 1149.1 fashion. What this means is that the signals needed to sequence the Ring through any particular test can be sent on the Backplane Test Bus by the TEST MASTER and the selected SLOT Link and accessed Ring will respond accordingly, and that the resulting Ring test data will be sent back onto the Backplane Test Bus and then to the TEST MASTER.

Figure 10A:
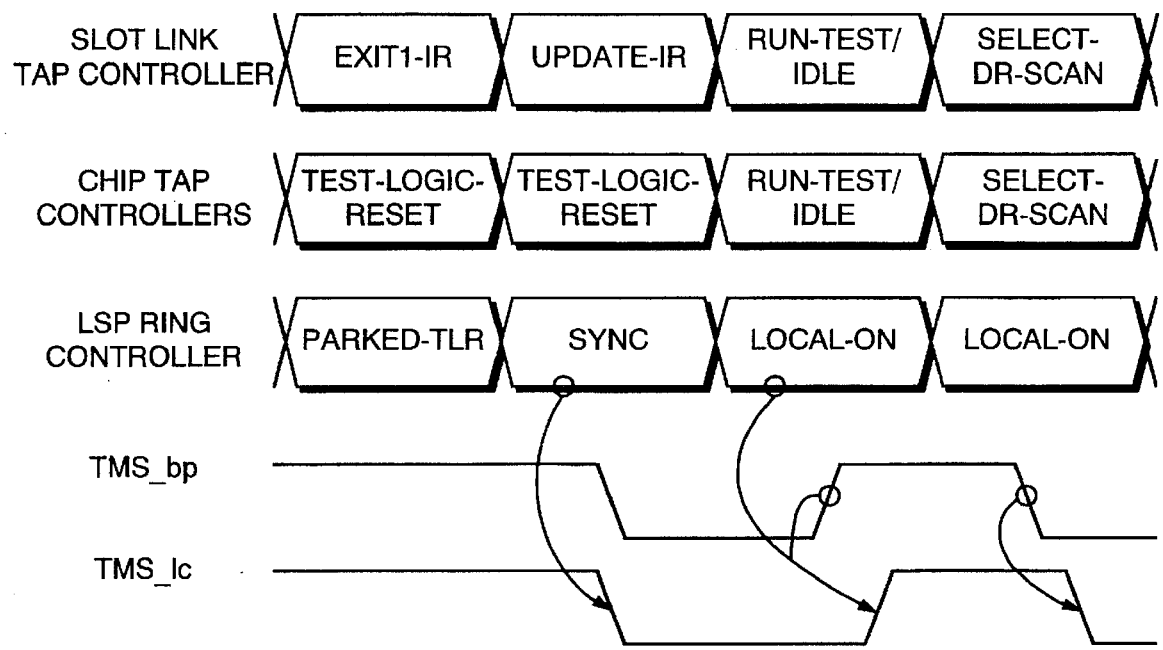
FIG. 10(a) shows a control signal and state sequence in the Preferred Embodiment of the present invention.

An example of the Ring accessing/synchronizing sequence is illustrated in FIG. 10(a), which shows as a function of time (from left to right) the states of the SLOT Link TAP Controller, of the Chip TAP Controllers in a particular Test Ring, and of the LSP Ring Controller associated with that Test Ring. Also shown are the TMS_bp signal driving the states, and the resulting TMS_lc. (Not shown is the clocking TCK_bp signal.) In this example, a Local Ring is initially parked with its Chip TAP Controllers in the Test-Logic-Reset state. For this Local Ring to be unparked, the UnPark instruction must be loaded into the SLOT Link Instruction Register. It is this instruction which causes the LSP Ring Controller to enter the Sync state and to force TMS_lc low on the next falling edge of TCK_bp following the entry of the SLOT Link TAP Controller into the Update-IR state, as shown. (This ensures that the Chip TAP Controllers go to the Run-Test/Idle state in anticipation of the SLOT Link TAP Controller doing the same.) It is seen that TMS_bp also goes low at that point, driven by the TEST MASTER. The effect of that TMS_bp level will be exerted on the SLOT Link TAP Controller on the next rising edge of TCK_bp. If that effect is to put the SLOT Link TAP Controller in the Run-Test/Idle state—as it would normally be following the "updating" of an instruction, then during the interval leading up to the next TCK_bp rising edge—i.e., while Run-Test/Idle is still the next state of the SLOT Link TAP Controller, the conditions necessary for the LSP Ring Controller to change to the Local-On state are satisfied. The LSP Ring Controller in the Local-On state causes TMS_lc to be connected directly to TMS_bp (on the falling edge of TCK_bp). All TMS signals are now the same—the degree to which TMS_lc is shown to lag TMS_bp is a non-quantitative representation of propagation delay through the SLOT Link—and all of the Chip TAP Controllers will continue to be in the same state as the SLOT Link TAP Controller; normal IEEE Std 1149.1 operations can proceed. Note that this sequence has a software restriction. For synchronization to occur directly after the UnPark instruction has been asserted (i.e., transferred into the SLOT Link Parallel Output Register by the SLOT Link TAP Controller sequencing through the Update-IR state), the SLOT Link TAP Controller must go immediately to its Run-Test/Idle state.

Figure 10B:
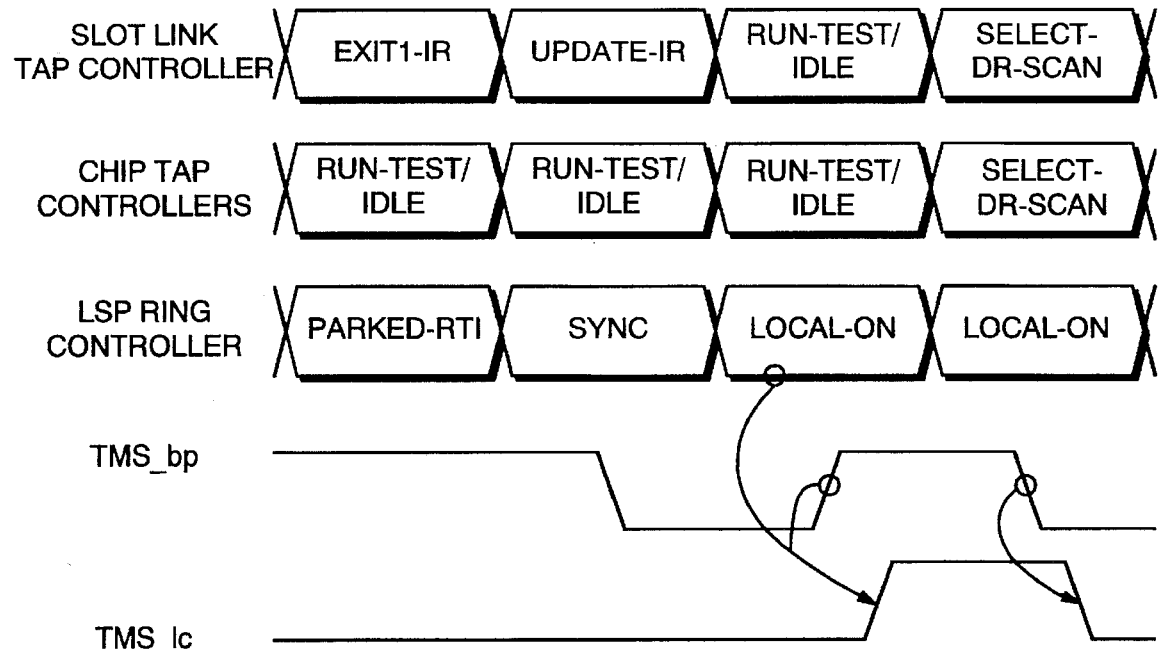
FIG. 10(b) shows a control signal and state sequence as for FIG. 10(a), but where the initial state of the SLOT Link TAP Controller was different.

An example of synchronizing from the Parked-RT/I state is shown in FIG. 10(b). In this case, the local Ring has been parked in its Run-Test/Idle state during a previous operation. The UnPark instruction is issued by the TEST MASTER, which changes the LSP Ring Controller to the Sync state, as above. Note that the Sync state is still entered as a necessary first step even though the local Ring is already in the Run-Test/Idle state, since the SLOT Link TAP Controller must be sequenced to its Run-Test/Idle state before synchronization can occur. The LSP Ring Controller will remain in the Sync state until this condition is met—as shown in FIG. 10(b).

Figure 10C:
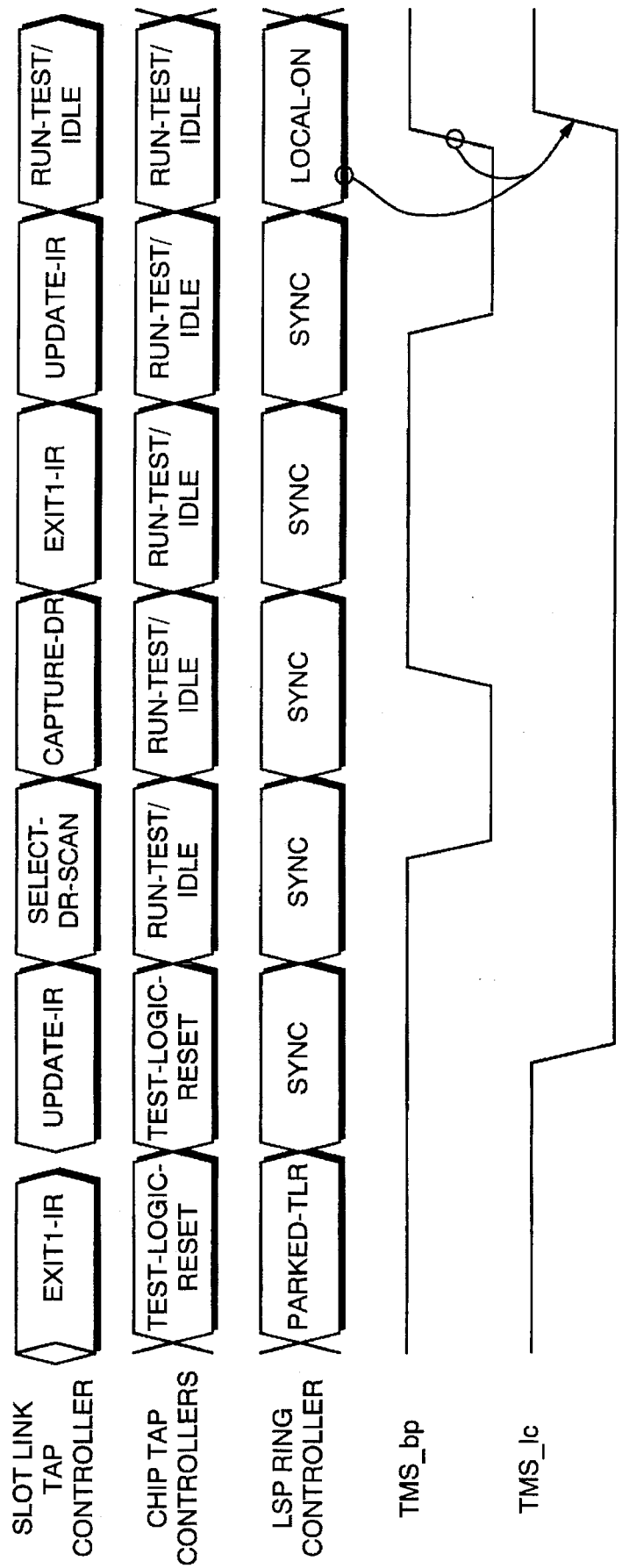
FIG. 10(c) another control signal and state sequence.

FIG. 10(c) shows a case where the SLOT Link TAP Controller—contrary to the above-stated condition—is not sequenced to the Run-Test/Idle state immediately after the UnPark instruction has been loaded (asserted)—i.e., TMS_bp is not made logic-low at that point, possibly because of an error in the testing software. Note that the LSP Ring Controller now remains in its Sync state and that TMS_lc is held low until the sequencing SLOT Link TAP Controller finally has as its next state Run-Test/Idle and the conditions are met for the LSP Ring Controller's transition to the Local-On state. This control over TMS_lc provides a "fail-safe" if the software does not satisfy the condition that it cause the SLOT Link TAP Controller to pass through Run-Test/Idle immediately after the UnPark instruction has been issued.

SLOT Link Configuration Register and Switching Network

Figure 11:
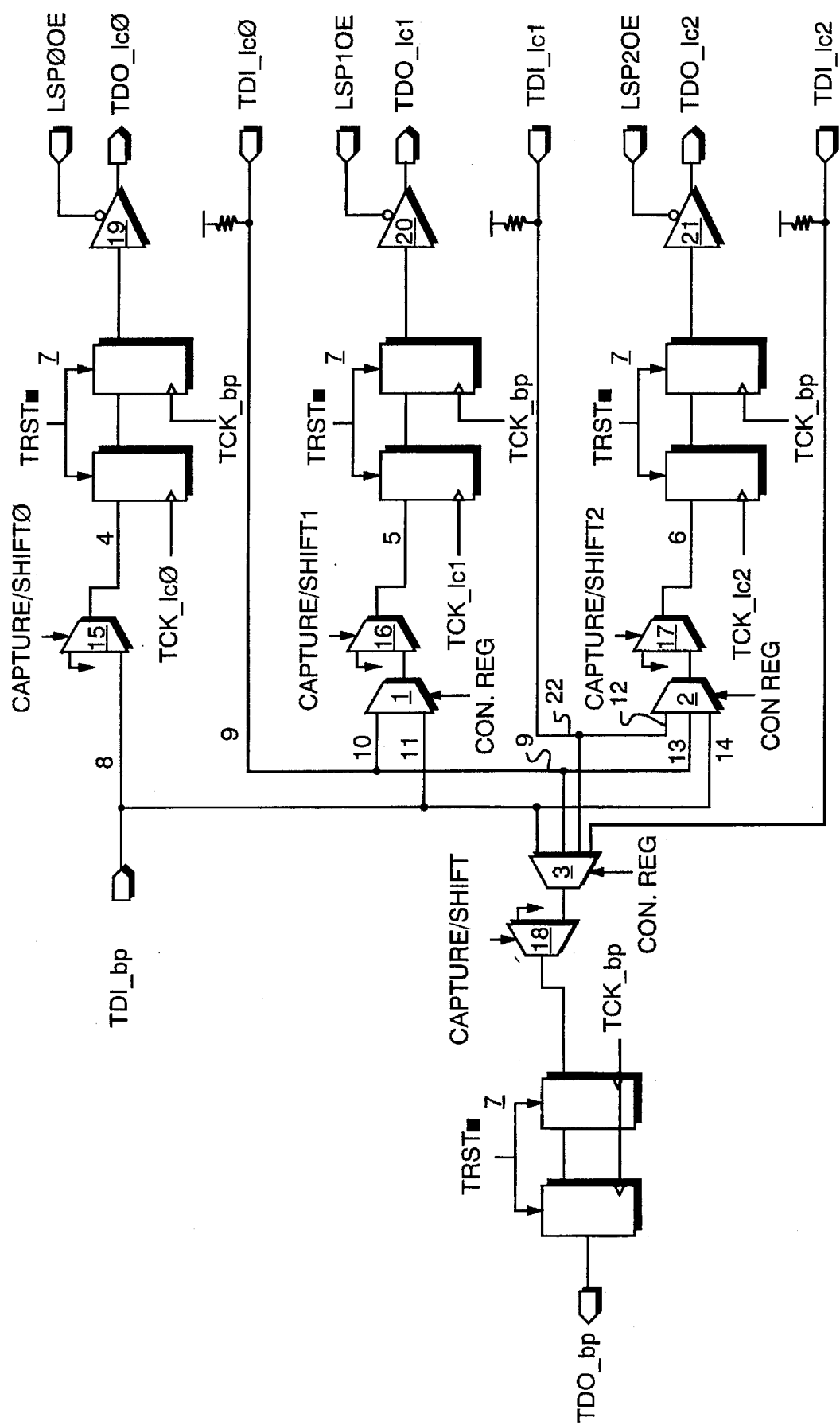
FIG. 11 shows a SLOT Link Switching Network of the Preferred Embodiment of the present invention.

In the Preferred Embodiment the configuring of Rings to be tested is handled by a SLOT Link Configuration Register coupled to a SLOT Link Switching Network. This combination permits the LSP Ring Controller instruction repertoire to be held to that necessary for only a single Test Ring, the list set out above: Park, UnPark, etc. The SLOT Link Configuration Register and Switching Network determine which Test Rings are placed in the TDI_bp/TDO_bp scan path and which LSP Ring Controllers receive the UnPark instruction. FIG. 11 depicts that part of the SLOT Link Switching Network which routes TDI_bp/TDO_bp for the case of a SLOT Link with three LSP Ring Controllers and associated LSP TAPs. The CON. REG control lines entering the various multiplexers (MUXs) come from various pins of the SLOT Link Configuration Register and determine whether or not a particular Ring will be placed in the TDI_bp/TDO_bp scan path.

The Configuration Register itself is accessed by the TEST MASTER through an IR-Scan sequence which loads the CONFIG instruction into the SLOT Link Instruction Register. When the CONFIG instruction is updated—i.e., transferred to the SLOT Link IR Parallel Output Register—the Configuration Register is placed in the TDI_bp/TDO_bp scan path. The TEST MASTER can then perform a DR-SCAN sequence to introduce the number into the Configuration Register needed to send desired control signals to the MUXs depicted in FIG. 11. Generally, this number will be latched into the Configuration Register as part of a set-up sequence and will not change frequently. An example Configuration Register instruction repertoire and control response is set out in Table I.

The flip-flop shown in each LSP TAP arm of the circuit of FIG. 11 is included as a means of equalizing the times of signal transmission between various stages in the circuit—of reducing the transmission time differentials between, e.g., the path from the TEST MASTER to the first stage in the first Test Ring and that from one Ring to the next. Their use permits higher speed performance—i.e., higher TCK_bp frequency—than would otherwise be the case.

their CON. REG. inputs are "don't cares.") For Configuration∅∅1, Ring ∅ alone is in the test loop; MUX 3 selects input node 9, TDI_lc∅. For Configuration∅11— Ring ∅ in series with Ring 1—MUX 1 will select input node 10, and MUX 3 input node 22. And so on.

Table 1 sets out the eight different Ring Configurations set up by the SLOT Link Configuration Register in response to the corresponding configuration codes sent by the TEST MASTER for a board with three LSP TAPs. Under "Ring Scan Configuration" in Table 1, the term "SLReg" refers to the SLOT Link register—which may be just a single stage— daisy-chained into the Test Ring. The single-bit delay-equalization stages put into the paths are itemized explicitly in listing the Ring Scan Configuration, with the word "bit" used in Table I to indicate a single scan element. These single scan elements act as "dummy Bypass" registers. That is, they load a logic ∅ while the SLOT Link TAP Controller is in the Capture-DR state and are enabled for shifting when the SLOT Link TAP Controller is in either the Shift-DR state or the Shift-IR state. It is clear when the Ring Scan Configuration is set out explicitly why the conventional ordering of TDO and TDI results in the terminology used earlier.

TABLE 1

| CONFIGURATION CODE | RING SCAN CONFIGURATION |
|---|---|
| 000 | TDI_bp→SLReg→bit→TDO_bp |
| 001 | TDI_bp→SLReg→bit→TDO_lc∅→TDI_lc∅→bit→TDO_bp |
| 010 | TDI_bp→SLReg→bit→TDO_lc1→TDI_lc1→bit→TDO_bp |
| 011 | TDI_bp→SLReg→bit→TDO_lc∅→TDI_lc∅→bit→TDO_lc1→TDI_lc1→bit→TDO_bp |
| 100 | TDI_bp→SLReg→bit→TDO_lc2→TDI_lc2→bit→TDO_bp |
| 101 | TDI_bp→SLReg→bit→TDO_lc∅→TDI_lc∅→bit→TDO_lc2→TDI_lc2→bit→TDO_bp |
| 110 | TDI_bp→SLReg→bit→TDO_lc1→TDI_lc1→bit→TDO_lc2→TDI_lc2→bit→TDO_bp |
| 111 | TDI_bp→SLReg→bit→TDO_lc∅→TDI_lc∅→bit→TDO_lc1→TDI_lc1→bit→TDO_lc2→TDI_lc2→bit→TDO_bp |

The outputs from the three tristate buffers shown on the right side of FIG. 11 go, respectively, to the first Chip TAP of each of the three Local Rings: Ring ∅, Ring 1, and Ring 2. Note that the local bus line to Ring ∅ is labelled TDO_lc∅ and the line from is labelled TDI_lc∅. (These are the three inputs on the right of FIG. 11.) As commented on above, this nomenclature is consistent with the fact that once a Ring is activated it always has in its daisy chain the SLOT Link TAP itself. The first TAP on the Ring into which TDI_bp passes is the SLOT Link TAP. The convention under IEEE Std 1149.1 is to have TDI entering the first TAP and TDO exiting, with the final TDO going to the external test bus. Nevertheless, Ring ∅ proper lies between TDO_lc∅ and TDI_lc∅, etc.

With continuing reference to FIG. 11, note that CONFIG control lines regulate the MUXs determining whether the TDI_bp line is connected to TDI_lc1 and TDI_lc2 output buffers. There is no similar control on the line TDI_lc∅, but this does not matter, since if Ring ∅ is not activated, nothing will be shifted into that Ring from TDI_bp. The purpose of the switching network is to route TDI_bp into those Rings which have been activated for testing by their respective LSP Ring Controllers.

Consider some typical Ring configurations. For Configuration∅∅∅, none of the Rings is included in the test loop; the SLOT Link Configuration Register causes MUX 3 to select its TDI_bp input. (With none of the local bus TDIs selected, it is immaterial what MUX 1 and MUX 2 select—

In the Preferred Embodiment, it is the SLOT Link Configuration Register in collaboration with the SLOT Link Switching Network that controls how TDI_bp and TDO_bp couple to the Test Rings. Similarly, the manner in which TMS_bp interacts with the Test Rings is determined by the SLOT Link Configuration Register in collaboration with the plurality of LSP Ring Controllers, the four-state diagram for which has been given in FIG. 9.

Figure 12:
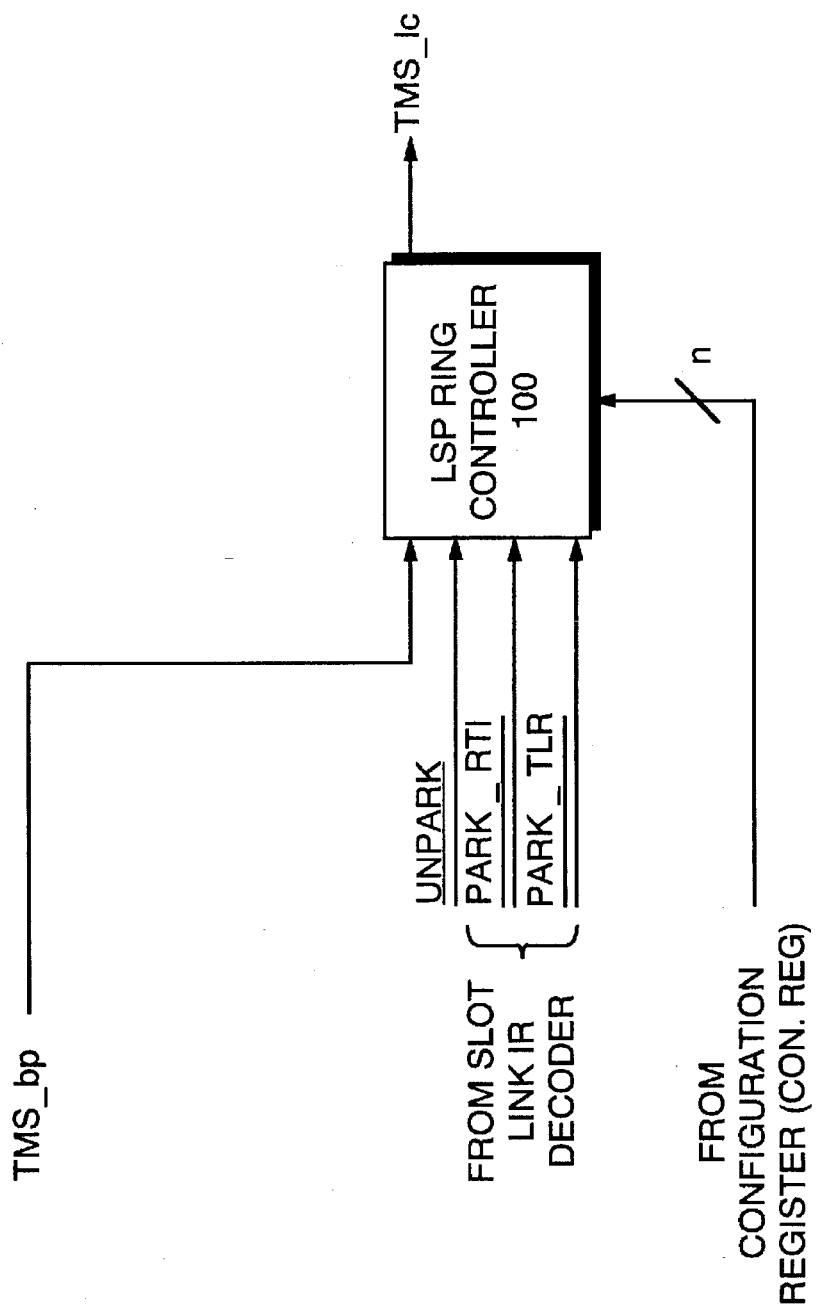
FIG. 12 is a schematic diagram of the LSP Ring Controller of the Preferred Embodiment of the present invention, showing lines controlling it.

FIG. 12 shows a single LSP Ring Controller 100 standing between TMS_bp and TMS_lc and controlled by signals from the SLOT Link IR and from the Configuration Register. In a multi-Ring module, LSP Ring Controller 100 of FIG. 12 will be one of several such units, one for each Test Ring. It is governed by its instruction repertoire {Unpark, Park-RT/I, Park-TLR . . . } coming from the SLOT Link IR Decoder, by the SLOT Link Configuration Register (which provides a "go/no-go" control determined by whether the Ring of that particular LSP Ring Controller has been chosen by the TEST MASTER to be activated), and by TMS_bp coming directly from the Backplane Test Bus.

Using multiple Rings presents the task of not only synchronizing the SLOT Link TAP Controller with a Ring of Chip TAP Controllers, but also one of synchronizing the individual LSP Ring Controllers to one another. It may be that two of the Rings had been parked in different states. This could occur, for example, when previous test operations accessed the two LSP TAPs separately and parked the Rings in the two different states; this possibility has to be dealt with as part of the Ring-accessing sequence. Under the Preferred Embodiment, the LSP Ring Controllers handle this situation gracefully by using the Sync state. This is illustrated in FIG. 13, which depicts as a function of time:

the states of the SLOT Link TAP Controller, the states of the Chip TAP Controllers of Ring 1, the states of the LSP Ring Controller associated with Ring 1, the states of the Chip TAP Controllers of Ring 2, the states of the LSP Ring Controller associated with Ring 2.

Figure 13:
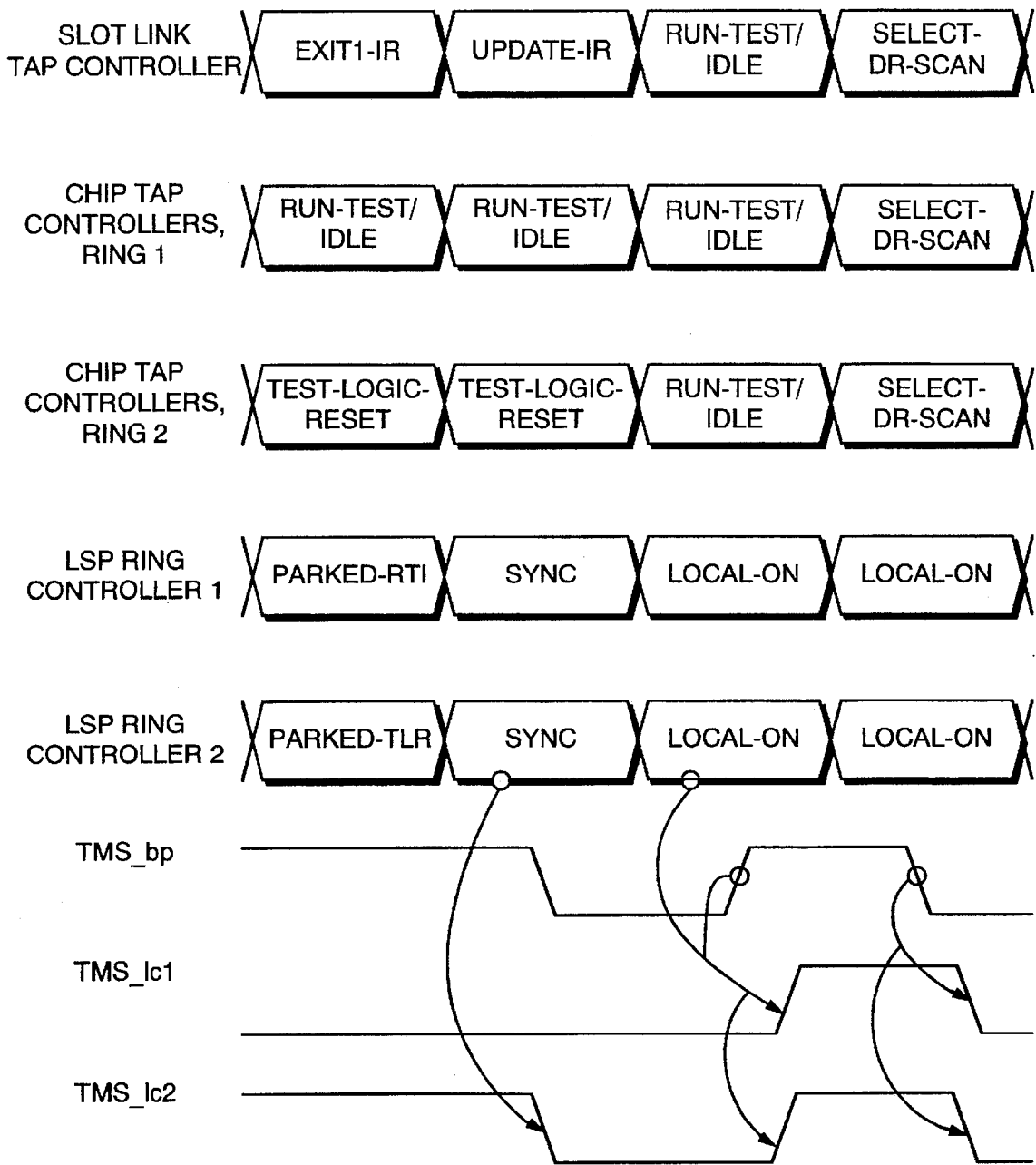
FIG. 13 shows a control signal and state sequence for a case where two Test Rings are active, and in particular shows what is involved in synchronizing the associated two LSP Ring Controllers.

More specifically, FIG. 13 depicts what happens when—through the cooperation of the SLOT Link Configuration Register—the UnPark instruction is sent concurrently to LSP Ring Controller 1 and LSP Ring Controller 2. The former had been parked in the Parked-RT/I state, the latter in the Parked-TLR state; UnPark sends each to the Sync state. (Note that for the case of the three LSP TAP modules, the unaddressed Ring, Ring Ø, will remain in whatever its previous state was.) In accord with the synchronization needed, both sets of Chip TAP Controllers must be in the Run-Test/Idle state before TMS_bp is tied to TMS_lc (now the TMS line for both Rings, i.e. connected in parallel to all the Chip TAP Controllers of both Rings now formed into a single series Test Ring.) The Chip TAP Controllers of Ring 1 are already in the Run-Test/Idle state; hence all that LSP Ring Controller 1 does in the Sync state is to hold those Chip TAP Controllers where they are, by forcing TMS_lc1 to 0. (See FIG. 3 and FIG. 9.) An additional tick of the TCK clock is required before the TMS_lc2=0 being forced by LSP Ring Controller 2 in the Sync state moves the Chip TAP Controllers of Ring 2 to the Run-Test/Idle state. Since the SLOT Link TAP Controller has also been put in the Run-Test/Idle the synchronization condition has been satisfied and both LSP Ring Controllers move automatically to the Local-On state. Note that the actual transitions to the Local-On state occur when the next state of the SLOT Link TAP Controller is going to be Run-Test/Idle. From that point on until one of the park instructions is sent, TMS_bp=TMS_lc1=TMS_lc2 and IEEE Std 1149.1 testing of both Test Rings proceeds as described above.

Reset Operations

Resetting the SLOT Link and the target IEEE Std 1149.1 devices can be accomplished in a variety of ways. If the SLOT Link TAP Controllers are reset, then the Chip TAP Controllers will be reset as well. Also, Chip TAP Controllers can be reset one Ring at a time.

That is, if Level 1 signals are those transmitted on the Backplane Test Bus and Level 2 signals those transmitted on one or another Local Test Bus, the following observations may be made. A Level 1 reset is performed by putting all the SLOT Link TAP Controllers into the Test-Logic-Reset state either synchronously—with TMS_bp sequencing them through the state diagram of FIG. 3—or with the (optional) asynchronous TRST pin. All LSP Ring Controllers will return to the Parked-TLR state. (See the LSP Ring Controller state diagram in FIG. 9; whenever the next state of a SLOT Link TAP Controller is going to be Test-Logic-Reset, the associated LSP Ring Controllers will go to the Parked-TLR state.) This means that all TMS_lc signals will be forced high, putting all Chip TAP Controllers into the Test-Logic-Reset state within three TCK cycles. Thus, Chip TAP Controllers will have been reset by a global reset performed at Level 1. Only Level 1 protocol will have been used, and none of the instruction repertoire specific to Level 2.

To reset individual Local ports, Level 2 protocol must be used, in particular, the Park_TLR instruction. If Chip TAP Controllers corresponding to a specific LSP TAP are parked in the Run-Test/Idle state and it is desired to reset them, i.e., to put them into the Test-Logic-Reset state, they must first be accessed—either by using the SLOT Link Configuration Register to send the UnPark signal from the TEST MASTER to that particular LSP Ring Controller. Once the Ring of interest is unparked—TMS_bp and TMS_lc synchronized—its Chip TAP Controllers can be sent to the Test-Logic-Reset state and reparked in the usual way.

In the Preferred Embodiment, the logic circuitry of the SLOT Link IR Decoder is such that LSP Ports of an individual SLOT Link can also can be achieved with a SOFTRESET instruction. When the Backplane Test Bus carries out an IR-Scan with this instruction, all TMS_lc signals are forced high, placing the corresponding Chip TAP Controllers into the Test-Logic-Reset state within three TCK cycles.

Asynchronous resets of Chip TAP Controllers can only be achieved via a power-down reset, or by routing the TRST signal to the available TRST pins of the Chip TAP Controllers.

Instructions Used in Preferred Embodiment of Invention

Defined Previously. By IEEE Std 1149.1 BYPASS: The Bypass register is selected for connection in the scan path if the SLOT Link has been successfully addressed. Operation is as defined in IEEE Std 1149.1, The BYPASS instruction opcode is 11111111.

NOTE: The Level 1 protocol defined above states that all instructions are interpreted as addresses while the SLOT Link Selection Controller is in the Wait state. This means that in this Invention the BYPASS instruction is ignored while the SLOT Link is in the Wait state, thus technically violating IEEE Std 1149.1, under which it is a mandatory instruction.

SAMPLE/PRELOAD: This is a double purpose instruction causing the Boundary-Scan register—Chip or SLOT Link—to be placed in the scan path. The "sample" part of the instruction allows the data flowing between chips—along the chip pins—at a given instant to be captured on a rising TCK edge without interfering with the operation of the chip. This allows diagnostic testing during operation of the system, a "snapshot" being afforded of what is going on in device under test or the board under test at a particular instant.

The "preload" part of the instruction permits a test vector—a high/low string of a length corresponding to the number of boundary-scan cells under test—to be shifted in but not asserted. The test vector is held in readiness to be applied to the output pins at a later time (see EXTEST) on a single TCK tick. The obvious advantage is that it allows the test voltages to be applied simultaneously to all pins without the TEST MASTER having to shift them in when the actual test is to take place.

Depending on the role to be performed by the test architecture of the present Invention, this instruction may be left out of the SLOT Link repertoire. For example, if the embodiment just involves a stand-alone SLOT Link, a Boundary-Scan Register is of little or no use because the SLOT Link is simply accessing the Local Test Bus. However, Boundary-Scan cells may be useful on non-TAP I/Os such as the SLOT-ID pins or if this architecture is used as a module on another chip.

NOTE: The Level 1 protocol defined above states that all instructions are interpreted as addresses while the SLOT Link Selection Controller is in its Wait state. This means that in this Invention the SAMPLE/PRELOAD instruction is ignored while SLOT Link is in the Wait state, thus technically violating IEEE Std 1149.1, under which it is a mandatory instruction.

EXTEST: This instruction places the Boundary-Scan Register in the scan path if the SLOT Link has already been successfully addressed. Its operation is as defined in IEEE Std 1149.1. As with SAMPLE/PRELOAD, this instruction may be left out, depending on the nature of the device of which the SLOT Link is a part. (If, for example, the SLOT Link is on an application-specific integrated circuit (ASIC), this instruction would definitely be included.) The EXTEST instruction opcode is ØØØØØØØØ.

NOTE: In this Invention the EXTEST instruction is ignored while the SLOT Link is in the Wait state, thus technically violating IEEE Std 1149.1, under which it is a mandatory instruction.

IDCODE: This instruction causes the Device Identification Register to be selected for connection in the scan path if the SLOT Link has already been successfully addressed. Defined in Preferred Embodiment of Present Invention ADDRESS: This is something of a quasi-instruction, being any number broadcast during an IR Scan while the SLOT Link Selection Controller is in the Wait state. Under this condition, any instruction received will be treated as an address to be loaded into each SLOT Link IR and examined for a match with the SLOT-ID. This "instruction" is valid only when the SLOT Link is in its Wait state.

Go-To-Wait: This instruction returns all SLOT Link Selection Controllers to the Wait state. It also causes all LSP Ring Controllers which are in the Local-On state to go to the Parked-TLR state (which resets the Chip TAP Controllers under the regulation of the respective LSP Ring Controllers).

Park-TLR: This instruction also causes the unparked LSP Ring Controllers (and associated Chip TAP Controllers) to park in the Test-Logic-Reset state. I.e., it causes an LSP Ring transition from the Local-On state to the Parked-TLR state.

Park-RT/I: This instruction causes the LSP Ring Controllers to make a transition from the Local-On state to the Parked-RT/I state. (I.e., it causes an unparked local Ring to park in the Run-Test/Idle state.)

UnPark: This instruction causes the LSP Ring Controller otherwise accessed in either the Parked-TLR state or the Parked-RT/I state to move to the Sync state.

SOFTRESET: This instruction will force all TMS_lc signals high, causing all Chip TAP Controllers affected to enter the Test-Logic-Reset state within 3 TCK cycles.

EXAMPLE OF EXTENDED TESTING SEQUENCE

The following sequence shows a more complete example of how one might use the Preferred Embodiment of the present Invention to carry out IEEE Std 1149.1 testing of a Ring of standard-compliant chips via the Backplane Test Bus. By assumption, the extended system of this example has ten backplane slots, eight of which contain boards loaded with standard-compliant test rings plus the SLOT Link and associated circuitry of the present Invention. Each SLOT Link is equipped with a SLOT Link TAP Controller, a SLOT Link Selection Controller, a SLOT Link Instruction Register, etc. as well as a 6-pin SLOT-ID bus defining and providing an electrical signal corresponding to a unique six-digit slot address. Also on each of the boards are two LSP TAPs and associated LSP Ring Controllers (regardless of the number of Test Rings actually on the board in question). Signals from a TEST MASTER are transmitted and test control thereby exercised through a four-lead Backplane Test Bus connected in parallel to all of the ten slots. A complete test sequence starting from the system having been powered down might proceed as follows:

First Step

The system is powered up. This puts all TAP Controllers (the eight SLOT Link TAP Controllers as well as all of the Chip TAP Controllers associated with the individual chips on the eight boards which are present) into the Test-Logic-Reset state. All LSP Ring Controllers—two on each of the eight boards—are thus in the Parked-TLR state, which means that they are forcing all TMS_lc lines logic-high, thereby causing all Chip TAP Controllers to remain in the Test-Logic-Reset state. Concurrently, all SLOT Link Selection Controllers are forced into the Wait state by the power-up, and each SLOT Link, therefore, is anticipating an address.

Second Step

With all of the SLOT Links awaiting an address, the TEST MASTER proceeds into an IR-Scan Sequence, first putting all of the SLOT Link TAP Controllers into the Select-IR-Scan, which causes the IR Shift Register of each SLOT Link to be placed into the TDI_bp/TDO_bp path (though only formally, since, until a SLOT Link is selected, the tristate TDO output buffer on each SLOT Link is disabled). When the TEST MASTER sequences the SLOT Link TAP Controllers through the Capture-IR state, a "Ø1" binary pattern hardwired into each SLOT Link is automatically loaded into the two least-significant-bit locations of the eight-bit shift register of SLOT Link Instruction Register, and the six-digit SLOT-ID is loaded into the next six places (if that optional feature is present). The TEST MASTER then proceeds through the rest of the IR-Scan sequence, putting the SLOT Link TAP Controllers into the Shift-IR state for the time required for the six-digit address of a particular board (SLOT Link) to be broadcast on TDI_bp. (If the tristate output buffers of the SLOT Links were enabled, the eight-digit number already there would be shifted out onto TDO_bp at this time; however, none of them is enabled.) The SLOT Link TAP Controllers are then all moved to the Update-IR state and the transmitted address compared with the hard-wired SLOT-ID by the SLOT Link Selection Controller on each board. This results in—at most—one SLOT Link Selection Controller changing to the Selected state and the others changing to the UnSelected state.

Third Step

The TEST MASTER then proceeds to another IR-Scan sequence, during which the Go-to-Wait instruction is to be shifted in so as to prepare the collection of SLOT Links for the next address to be broadcast. As before, as the SLOT Link TAP Controller of the selected SLOT Link sequences through the Capture-IR state, the SLOT-ID and the 01 hardwired into the SLOT Link are transferred to the SLOT Link IR Shift Register. Then, as Go-to-Wait is being shifted in, this number is shifted out, and back to the TEST MASTER, the output buffer being enabled for the SLOT Link in the Selected state. Although this number does not generally add to the information of the TEST MASTER, it does provide a positive affirmation of the presence of the board addressed. If the earlier-addressed board is absent, this polling during the transmission of the Go-to-Wait instruction will result in an all-ones number being received by the TEST MASTER (because, as a standard-compliant device, its TDI pin will be stuck at high in the absence of a driving signal). At the Update-IR conclusion of the IR-Scan sequence, the Go-To-Wait command is moved to the IR Parallel Output Register; its assertion places all of the SLOT Links back in the Wait state, preparing the system for a repeat of the steps thus far. In this example, the process is repeated until each of the ten boards possibly present has been addressed and polled.

Fourth Step

With the polling complete, and the TEST MASTER in possession of a list of boards present, actual fault testing proceeds on those boards. The TEST MASTER selects the first board to be tested—Board Ø, now known to be present—by doing an IR-Scan sequence with the address of SLOT Link Ø, putting SLOT Link Ø in the Selected state and all the others in the UnSelected state. Assume that Board Ø has two Test Rings, one for each of the LSP TAPs associated with its SLOT Link. The first test objective will be to test the interconnections between chips on this Board Ø. For this, the most efficient Ring configuration is that with both Rings placed in series to form one large Test Ring. To do this, the TEST MASTER carries out an IR-Scan, loading in the appropriate configuration instruction to be read by the Configuration Register (see Table I). Another IR-Scan then loads the CONFIG instruction. With CONFIG asserted and the appropriate bit code in the Configuration Register, the next IR-Scan sequence loads the UnPark instruction. This unparks both LSP Ring Controllers, sending them to the Sync state and moving all affected Chip TAP Controllers from the Test-Logic-Reset state to the Run-Test/Idle state. With TMS_bp, the SLOT Link TAP Controller is then sent to the Run-Test/Idle state itself, to align it—synchronize it—with the Chip TAP Controllers. This causes the two LSP Ring Controllers move to the Local-On state and normal IEEE Std 1149.1 testing of the chips on that board may be commenced by the TEST MASTER. To run an interconnect test on Board Ø, an IR-Scan sequence is made to load the IEEE Std 1149.1 instruction SAMPLE/PRELOAD into each Chip Instruction Register in the combined Ring under test, and to load the BYPASS instruction into the SLOT Link Ø Instruction Register. (Recall that the SLOT Link TAP is just another member of the IEEE Std 1149.1 daisy chain once testing has begun. Sending the BYPASS instruction to that member of the chain ensures that it will just present a single stage to the Backplane Test Bus during the testing to follow.) A DR-Scan sequence is now performed to preload the first test vector, i.e., the array of zeros and ones eventually to be applied to the pins of the extended test Ring. Under the PRELOAD instruction, this number is latched into the Boundary Scan Register Parallel Output Register, to be retrieved in parallel in the next step.

The next step is to perform an IR-Scan sequence to load the EXTEST instruction into all the Chip TAP Instruction Registers (and to leave BYPASS the current instruction in the SLOT Link Ø Instruction Register). The appropriate sequencing is then performed to apply the test vector which had been preloaded into the Boundary Scan Registers and to shift out to TDO_bp the effect caused by this voltage pattern on the pins in the Ring. This completes the interconnect test on Board Ø.

Fifth Step

Upon completion of the interconnect test on Board Ø, the Test Rings on that board are parked by loading the Park-TLR instruction into the SLOT Link Ø Instruction Register. This causes the TMS_lc line of the two local Rings to be forced high, sending all of the Chip TAP Controllers into the Test-Logic-Reset state. The TEST MASTER then broadcasts the Go-To-Wait instruction, causing Board Ø to be deselected selected, and the other boards prepared to be addressed. I.e., all of the SLOT Link Selection Controllers are returned to the Wait state. Board 1 is addressed next, followed by the rest of the boards in the system, always using a sequence similar to that of steps 3 through 5.

Sixth Step

Figure 14:
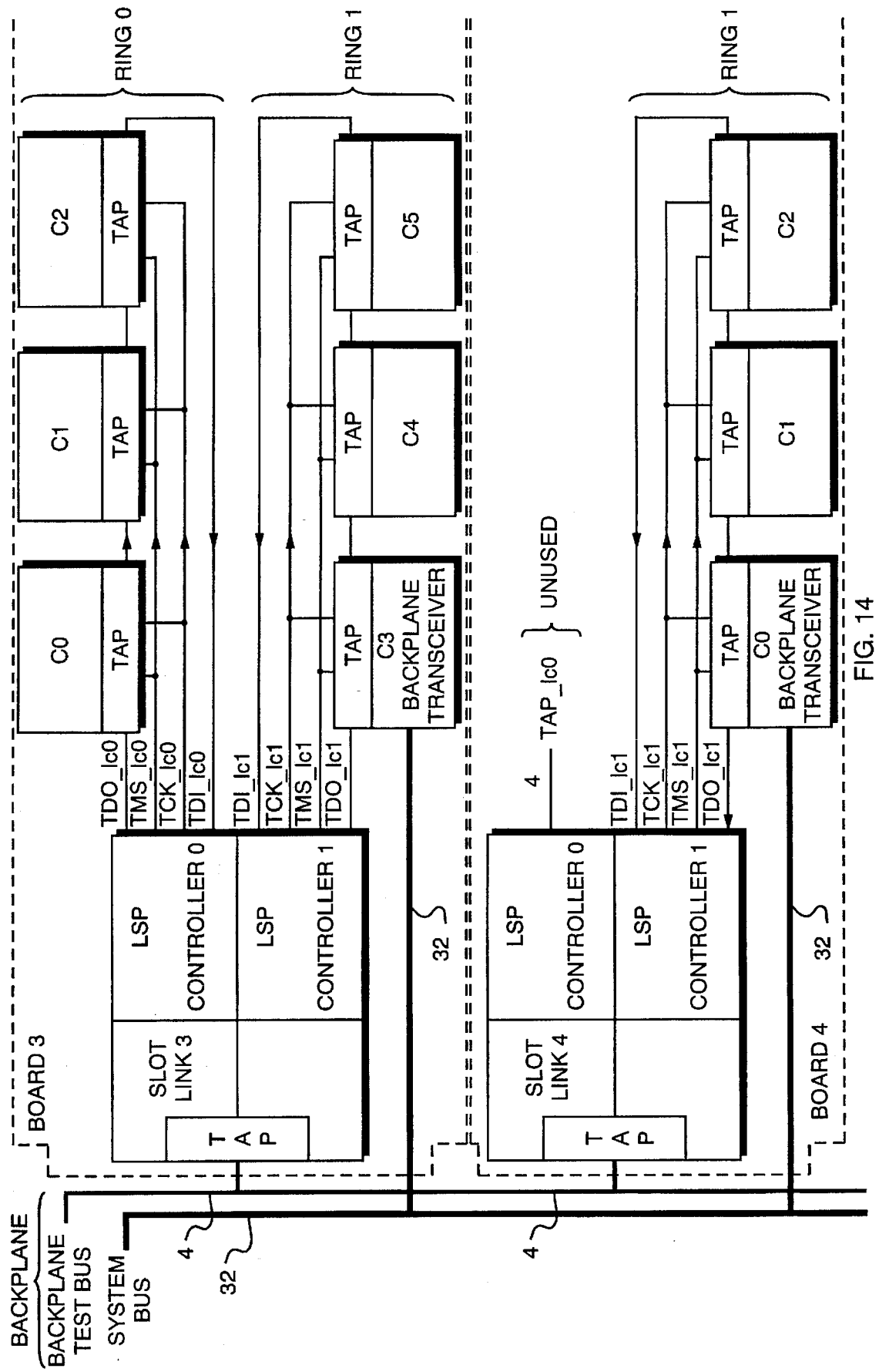
FIG. 14 schematically illustrates two adjacent printed circuit boards, indicating the backplane coupling between the two boards and suggesting how that coupling can be tested in the Preferred Embodiment.

After testing the interconnect on the individual boards, the next step is to test the interconnections between the boards, i.e., the backplane interconnect. For example, consider testing the interconnect between Board 3 and Board 4. First, Board 3 is addressed and its SLOT Link Selection Controller placed in the Selected state. Assume that the device of interest on Board 3, the device which exchange data with the backplane resides on Ring 1, and in particular is Chip 3. See FIG. 14. The UnPark instruction is used in concert with the SLOT Link Configuration Register to activate this Ring, as above. The appropriate IR-Scan and DR-Scan sequences are then performed so as to set up a particular pattern for Chip 3 to send to the backplane.

To test the backplane interconnect, the transceiver on Board 4 must be used to sample the data forced by the transceiver of Board 3. Before doing this, Ring 1 on Board 3 must be parked, but in such a way that its Chip 3 continues forcing data onto the backplane. The Park-RT/I instruction is used (in continuing concert with the SLOT Link Configuration Register) so as to place LSP Controller 1 of Board 3 in the Park-RT/I state, and hence to place the associated Chip TAP Controllers in the Run-Test/Idle state.

Board 3 is now de-selected, using the Go-To-Wait command—which also takes the SLOT Link of Board 4 out of the UnSelected state—and the SLOT Link of Board 4 addressed and placed into the Selected state. Using the SLOT Link Configuration Register, the UnPark instruction is sent to Ring 1 of that board and appropriate subsequent sequencing used to synchronize it with the Backplane Test Bus and then to load the EXTEST instruction into the bus transceiver on Board 4. The backplane data arriving at Chip 0 of that Test Ring is sampled while the SLOT Link TAP Controller of Board 4 is in the Capture-DR state. After moving that SLOT Link TAP Controller into the Shift-DR state, the results are then shifted out to the TEST MASTER for analysis. Obviously, this procedure is then repeated for all of the other chips constituting Backplane Test Bus transceivers.

When testing is complete, the TEST MASTER sends out the SOFTRESET instruction to each SLOT Link, putting all local TAP Controllers into the Test-Logic-Reset state.
Specific Variations and Extensions of Preferred Embodiment By setting out a particular Preferred Embodiment and some examples of how the test architecture and protocols of the present Invention can be implemented, no limitation is implied thereby on the Invention's applicability. This Invention is seen as a fundamental advance in the testing art and open to many different implementations. As but a few of the additional ways in which the Invention strategy and test architecture set out above may be varied or enhanced, the following options are suggested.

Figure 16:
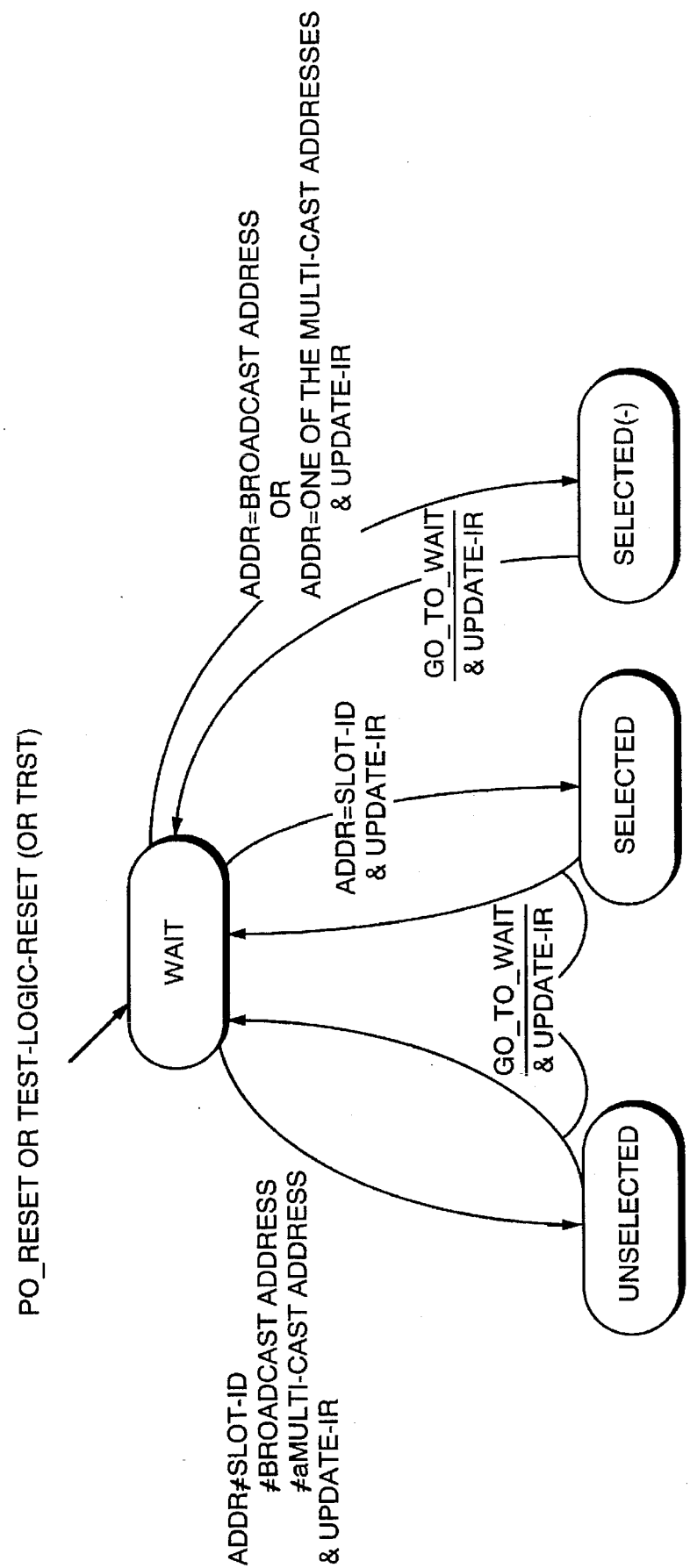
FIG. 16 depicts a SLOT Link Selection Controller which could implement Broadcast Address and Multi-Cast Address modes of the invention.

(1a) Enable a Broadcast Address whereby all of the SLOT Links can selected—though in a more limited sense—simultaneously. For example, the SLOT Link Selection Controller can be provided—as shown in FIG. 16—with a fourth state, Selected(−), identical to the Selected state except the fact that it does not enable the TDO_bp output buffer. Unlike the Selected state—which will be entered by a particular SLOT Link Selection Controller from its Wait state only when the TEST MASTER transmits an address matching the corresponding SLOT-ID—the Selected(-) state will be entered by all SLOT Link Selection Controllers upon the TEST MASTER sending out a particular Broadcast Address. All SLOT Link Selection Controllers will be designed to recognize this Broadcast Address. For example, 1B (0001 1011) would be a reserved address assigned to the Broadcast Address mode and not available as a possible SLOT-ID. When this address is loaded into the SLOT Link IR Parallel Output Registers in the usual fashion, all the SLOT Link Selection Controllers in the Wait state would go to the Selected (-) state. This Broadcast Address mode could be used for batch operations. For example, at the end of a test sequence such as set out above, the SOFTRESET instruction could be sent out to all SLOT Links simultaneously. As another example, the Broadcast Address mode could be used to cause all SLOT Links to load the SLOT-ID in the SLOT Link Instruction Register. Although it could not be shifted out at that point, with the TDO_bp buffer not enabled—it would be all ready to be shifted out to the TEST MASTER when the SLOT Link Selection Controllers were subsequently put—one at a time—into the Selected state.

(1b) Enable Multi-Cast Addresses, similar to the Broadcast Address but with groups of boards consisting of fewer than all of the boards being selected. This would be implemented by several additional reserved addresses. With 1B reserved for the Broadcast Address, the four addresses 1C, 1D, 1E, 1F could be reserved for simultaneous partial selection of sub-sets of the boards. These four addresses differ in only their two least significant bits. Thus a two-bit Multi-Cast Group Register could be used to assign each board to one of four different groups. One approach would then be for the appropriate two-bit pattern to be loaded into the Register on a given board by first addressing the board with a normal address and then using a special ACCMGCR instruction. Subsequently, when the TEST MASTER transmitted one of the Multi-Cast addresses with all of the SLOT Link Selection Controllers in the Wait state, those SLOT Link Selection Controllers on the group of boards to be selected will go into the Selected(-) state while all of the others will go into the DeSelected state.

Summarizing the Invention as modified by (1a) and (1b), the SLOT Link Selection Controller would be set up to look for and recognize three types of address while in the Wait state: Normal, Broadcast, and Multi-Cast.

(2) Encode the instructions and data with a parity check or by CRC.

(3) Provide non-volatile memory with the test setup for storing test and maintenance information normally transmitted on the Backplane Test Bus, e.g., all of the board IDs, a maintenance record, a fault log, etc.

(4) Provide an additional signal on the backplane for interrupt generation, triggered by certain interrupt events, such as parity errors or board-specific error conditions. An interrupt could be generated also if the TEST MASTER failed to issue the correct sequence for synchronization of the local Rings, i.e., where TMS_bp fails to call for a TAP Controller transition to the Run-Test/Idle state immediately after the UnPark instruction had been conveyed.

(5) Include linear-feedback shift registers (LFSRs) which will automatically perform pattern generation and signature compaction.

(6) Include one or more counters usable as timers during autonomous operations such as Built-In Self Tests.

(7) Provide internal loop-back functions to test the SLOT Link itself before the scanning of local Test Rings commences, i.e., before local Ring insertion into the scan.

(8) Provide an internal loop-around function that pipes data appearing at TDI_lc directly back onto TDO_lc. This may be useful in scan operations which are "read-only" and for which a safe background pattern must otherwise be scanned in.

(9) Stop the local test clocks (TCK_lc) when the associated LSP TAPs are not being accessed. (I.e., block TCK_bp from passing the local LSP ports.) This would conserve power and reduce EMI emission during system test mode, perhaps to a significant extent.

(10) Use an alternative means of configuring multiple Test Rings on a single module. Instead of incorporating a switching network into the SLOT Link, extend the instruction repertoire of the LSP Ring Controllers. For example, the UnPark instruction can become set of instructions, UnParkXXX. .X, directed at a module with multiple Test Rings—e.g, eight instructions UnParkXXX for a module with three Rings. The LSP Ring Controllers would then be designed so that, for example, the UnParkØØ1 instruction will unpark Ring Ø, the UnParkØ11 instruction will unpark Ring Ø and Ring 1 concurrently, etc. Conversely, the LSP Ring Controller associated with Ring 2 would respond to neither of these commands.

Figure 15:
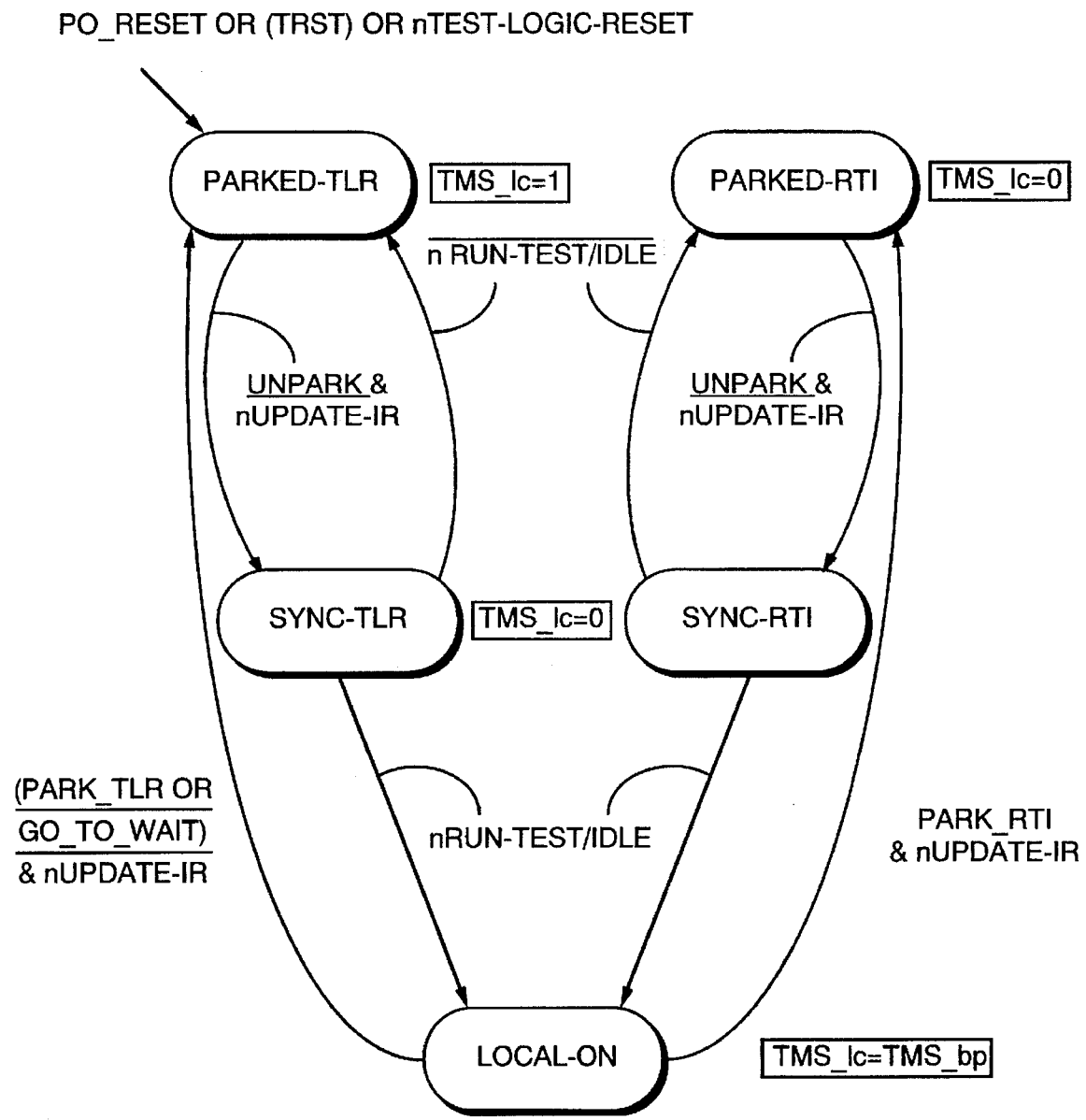
FIG. 15 shows the state diagram for an LSP Ring Controller which is a variant on the one incorporated in the Preferred Embodiment.

(11) Provide additional "fail-safe" provisions in the instruction repertoire of the LSP Ring Controllers. In particular, arrange the logic in this state machine so that (a) if an LSP Ring Controller is in the Sync state when the SLOT Link TAP Controller is in the Update-IR state and (b) the next state is of the SLOT Link TAP Controller not going to be Run-Test/Idle, then the LSP Ring Controller is sent back to the Parked-RT/I state. This will repark the Local Test Ring, and require that another UnPark instruction be sent before further sequencing can be imposed on that LSP TAP. See FIG. 15 for a state diagram for such an alternate LSP Ring Controller, a five-state machine.

(12) Utilize a simplified version of the Invention for improved single board testing. A stand-alone SLOT Link without a Selection Controller, but with the rest of the associated circuitry, including the ring switching network and LSP Ring Controllers could be installed on a single board having more than one Test Ring. This would afford a more efficient means of configuring and testing the different Test Rings, even if the completed test system was not installed.

We claim:

1. Boundary-scan test apparatus for use with an electronic system having a printed circuit board, said printed circuit board having one or more test chains of boundary-scan-testable integrated circuits (ICs), wherein said printed circuit board is removably insertable into a circuit board slot, said test apparatus comprising:

(a) a backplane test bus connectable to a central test controller and connected to said circuit board slot; and (b) a test chain controller for activating a particular one of said test chains so that a boundary-scan test vector can be transferred to said particular test chain and for then parking said particular chain with said test vector remaining in said chain, wherein said test chain controller is connected to said backplane test bus whenever said board is inserted into said circuit board slot.

2. The boundary-scan test apparatus as claimed in claim 1 wherein said backplane test bus comprises a test-data-in line, a test-data-out line, a clocking line, and a test-mode-select line, wherein said clocking line is usable to convey a clock signal to pace testing operations and in particular to pace a transferring-in of test input data and instructions from said test-data-in line, for transferring data into said chain of boundary-scan-testable ICs, and for transferring out test output results onto said test-data-out line.

3. The boundary-scan test apparatus as claimed in claim 2 wherein said board also has a switching network means for connecting said test-data-in line to one or more of said test chains in such a way that an expanded test chain comprising one or more of said test chains coupled in series is configured so that test input data can be transferred into, and test output data transferred out from, successive test chains, said switching network coupling to said backplane test bus whenever said board is inserted into said circuit board slot.

4. The boundary-scan test apparatus as claimed in claim 1 wherein said test chain controller comprises a plurality of four-state finite state machines (four-state machines), each of said four-state machines having a test-mode-selector line input and a local test-mode-selector line output for each of said test chains and having a first state (Park-Reset State), a second state (Park-Idle State), a third state (Sync State), and a fourth state (Local-On State), wherein any one of said plurality of four-state machines in said Park-Reset State forces said local test-mode-selector line output to drive said boundary-scan-testable ICs into a local reset state, wherein said four-state machine can be moved from either said Park-Reset State or said Park-Idle State to said Sync State by said central test controller transmitting a particular unpark command wherein said four-state machine in said Sync State acts to correlate signals from said test-mode-selector input line with said local test-mode-selector output line so as to synchronize said boundary-scan-testable ICs with said central test controller.

5. A boundary-scan test apparatus for use with an electronic system having a plurality of printed circuit boards, each of said plurality of printed circuit boards having one or more test chains of boundary-scan-testable integrated circuits (ICs), wherein each of said printed circuit boards is removably insertable into any one of a plurality of circuit board slots, said test apparatus comprising:

(a) a backplane test bus connectable to a central test controller, wherein said backplane test bus is connected in parallel to each of said plurality of circuit board slots;

(b) a board selection device for selecting any one of said plurality of printed circuit boards, wherein said board selection device is connected to said backplane test bus;

(c) a plurality of test chain controllers corresponding in number to the number of test chains on an individual printed circuit board, said test chain controllers designed to activate a particular test chain of said test chains so that a boundary-scan test vector can be transferred to said particular test chain and for then parking said particular test chain with said test vector remaining in said test chain; and (d) board identification means for establishing particular board identifiers corresponding to said plurality of printed circuit boards, wherein said board identification means is connectable to said board selection device.

6. The boundary-scan test apparatus as claimed in claim 5, said board selection device comprising a plurality of individual board selectors corresponding in number to the number of said printed circuit boards, wherein each of said plurality of individual board selectors is associated with a particular one of said printed circuit boards.

7. The boundary-scan test apparatus as claimed in claim 6 wherein each of said individual board selectors includes command-activated means for comparing an identifier transmitted by said central test controller to said particular board identifiers and, upon establishing that said identifier transmitted by said central controller matches a particular board identifier of a first corresponding printed circuit board, for enabling a boundary-scan test input vector to be transferred from said backplane test bus to said particular test chain of said first corresponding printed circuit board and enabling a boundary-scan test output vector to be transferred from said particular test chain of said first corresponding printed circuit board to said backplane test bus, wherein said board selection device can be used to compare a particular board identifier of a second corresponding printed circuit board without removing said boundary-scan test input vector from said first corresponding printed circuit board.

8. The boundary-scan test apparatus as claimed in claim 6, further comprising a plurality of individual board controllers corresponding in number to the number of said primed circuit boards, wherein each of said individual board controllers comprises an individual board selector of a particular printed circuit board and links said backplane test bus with a particular test chain controller of that same printed circuit board, each of said plurality of printed circuit boards located in said circuit board slots comprising test-devoted edge connectors deployed to connect corresponding individual board controllers to leads of said backplane test bus.

9. The boundary-scan test apparatus as claimed in claim 8 wherein said board identification means (SLOT-ID) is a binary number generator and wherein said SLOT-ID provides to said individual board controllers an electrical signal corresponding to a particular board identifier of a particular printed circuit board.

10. The boundary-scan test apparatus as claimed in claim 9 wherein each of said plurality of individual board selectors of said board selection device is a finite state machine with a first selector state causing said board selection device to compare said identifier transmitted by said central test controller with said particular board identifier generated by said SLOT-ID, wherein an individual board selector of said board selection device will move from said first selector state to a second selector state upon establishing that said identifier transmitted by said central test controller matches said particular board identifier and wherein said individual board selector will move from said first selector state to a third selector state upon establishing that said identifier transmitted by said central test controller does not match said particular board identifier, wherein said individual board selector in said second selector state enables data to be shifted into a corresponding individual board controller from said backplane test bus and out from said corresponding individual board controller onto said backplane test bus, thereby enabling said boundary-scan test input vector to be shifted into said chain of ICs and said boundary-scan test output vector to be shifted out of said chain and back to said central test controller, and wherein said individual board selector can be moved out of said second selector state and back to said first selector state upon the transmission of a wait command by said central test controller, without requiring a resetting of said test chains.

11. The boundary-scan test apparatus as claimed in claim 10 wherein said backplane test bus comprises a test-data-in line, a test-data-out line, a clocking line, and a test-mode-select line, wherein during testing said clocking line conveys a clock signal used to pace testing operations and in particular to pace a shifting in of test input data and instructions from said test-data-in line, for shifting data into said chain of boundary-scan-testable ICs of a particular board-under-test, and for shifting out test output results onto said test-data-out line, and wherein an output buffer on said board-under-test prevents said test output results from being shifted out of said board under-test onto said test-data-out line unless said board-under-test has been selected by said individual board selector being moved to said second selector state.

12. The boundary-scan test apparatus as claimed in claim 11 wherein said individual board selector has a fourth selector state identical to said second selector state except that said output buffer is not enabled, and wherein said individual board selector is moved from its first selector state to said fourth selector state by said central test controller transmitting one of several reserved general addresses.

13. The boundary-scan test apparatus as claimed in claim 11 wherein each of said individual board controllers comprises a switching network means for connecting said test-data-in line to one or more of said test chains on a selected board in such a way that an expanded test chain comprising one or more of said plurality of test chains coupled in series is created for shifting test data into and out from successive test chains.

14. The boundary-scan test apparatus as claimed in claim 11 wherein each of said test chain controllers comprises a plurality of four-state finite state machines (four-state machines), each of said four-state machines having a backplane test-mode-selector line input and a local test-mode-selector line output for each of said plurality of test chains and having a first state (Park-Reset State), a second state (Park-idle State), a third state (Sync State), and a fourth state (Local-On State), wherein any one of said plurality four-state machines in said first state forces said local test-mode-selector line output to drive said boundary-scan-testable ICs into a local reset state, wherein said four-state machine can be moved from either said Park-Reset State or said Park-Idle State to said Sync State by said central test controller transmitting a particular unpark command, wherein said four-state machine in said Sync state acts to correlate signals from said input with said output so as to synchronize said boundary-scan-testable ICs with said central test controller.

15. Apparatus for testing an electronic system containing one or more circuit modules, each module having one or more IEEE-Std-1 149.1-compliant integrated circuits (ICs) coupled together by local test buses into local test rings, said apparatus comprising:
  a. a system test bus connectable to a central test controller and connected in parallel with circuit module slots into which said circuit modules are insertable,
  b. a module interface circuit associated with each said module, said module interface circuit comprising a SLOT Link Controller, a SLOT Link Instruction Register, SLOT Link Data Registers, Selection Controller logic means and Ring Controller logic means,
  c. a distinct identification means (SLOT-ID) associated with each of said circuit module slots, wherein said Selection Controller logic means permit each said module to be selected for testing by said central test controller by means of transmitting a specific identifier signal on said system test bus, wherein said Selection Controller logic means:
    i. is placeable in a Wait state receptive to said identifier signal and designed to compare said identifier signal with said SLOT-ID and
    ii. which then changes to a Selected state if and only if said identifier signal matches said SLOT-ID and which changes into an UnSelected state otherwise, wherein said Selection Controller logic means in said Selected state enables coupling between said system test bus and a local test ring of said module subject to further regulation by said Ring Controller logic means such that said ICs on said local test ring are then testable by said central test controller using IEEE Std 1 149.1 test protocol, and wherein said Selection Controller logic means is returnable by said central test controller to said Wait state in such a manner that said ICs on said local test ring are left in a test state imposed by said central test controller during prior testing.

16. Apparatus as claimed in claim 15 wherein said Selection Controller logic means is a three-state finite state machine (three-state machine) transferable among a Wait state, a Selected state, and an UnSelected state in response to a Go__To__Wait command transmitted by said central test controller and to certain state-transition conditions, wherein said Go__To__Wait command causes said three-state machine in either said Selected state or in said UnSelected state to move to said Wait state, wherein said three-state machine already in said Wait state changes to said Selected state upon said central test controller transmitting an identifier matching said SLOT-ID of said module associated with said three-state machine, wherein said three-state machine already in said Wait state changes to said UnSelected state upon said central test controller transmitting an identifier not matching said SLOT-ID, and wherein said three-state machine is placed in said Wait state upon said electronic system being powered up.

17. Apparatus as claimed in claim 16 wherein stud Ring Controller logic means is a combination of a switching network and individual Ring Controllers configured to separately activate (unpark) each of said test rings, each of which is associated with an individual Ring Controller, and for combining one or more of said test rings into an extended test ring for IEEE-Std-1 149.1-testing, wherein each said individual Ring Controller exercises hegemony over a Test Mode Selection line (TMS__lc) in a test ring associated with said individual Ring Controller so as to ensure that during IEEE-Std-1 149.1-testing of said test ring signals on said TMS__lc are the same as signals transmitted on a backplane test bus Test Mode Selection line (TMS__bp) and that said IEEE-Std-1 149.1-compliant ICs and said SLOT Link Controller have a same IEEE-Std-1 149.1-defined state.

18. Apparatus as claimed in claim 17 wherein each said individual Ring Controller is a four-state finite state machine (four-state machine) transferable among a Parked-TLR state, a Parked-RT/I state, a Sync state, and a Local-On state subject to commands from said central test controller mediated by said SLOT Link Controller, wherein said four-state machine in either said Parked-TLR state or in said Parked-RT/I state is sent to said Sync state by an UnPark command, wherein said four-state machine in said Sync state forces said ICs on said local test ring to a IEEE-Std-1149.1 Run-Test/Idle state, and wherein said four-state machine in said Sync state transits to said Local-On state as said SLOT Link Controller transits to said IEEE-Std-1149.1 Run-Test/Idle state, whereupon said four-state machine causes said TMS__bp to couple directly to said TMS lc.

19. Apparatus as claimed in claim 18 wherein said four-state machine can be changed from said Local-On state to said Parked-RT/I state by said central test controller transmitting a Park command, wherein said four-state machine can be changed from said Local-On state to said Parked-TLR state by said central test controller transmitting either a Park__TLR command or a Go__To__Wait command, and wherein said four-state machine is placed in said Parked-TLR state by said electronic system being powered up or by said SLOT Link Controller being placed in a IEEE-Std-1149.1 Test-Logic-Reset state.

20. A boundary-scan test method for testing an electronic system having a printed circuit board, said printed circuit board having one or more test chains of boundary-scan-testable integrated circuits (ICs), wherein said printed circuit board is removably insertable into a circuit board slot connected to a backplane test bus, said test method comprising the steps of:

(a) activating a particular first one of said test chains;

(b) conveying a first boundary-scan input test vector from a central test controller to said first particular test chain;

(c) parking said first particular chain with said first input test vector remaining in said first particular chain;

(d) activating a particular second one of said test chains; and (e) retrieving a second boundary-scan output test vector from said second particular test chain.

21. The boundary-scan test method as claimed in claim 20 wherein said backplane test bus comprises a test-data-in line, a test-data-out line, a clocking line, and a test-mode-select line, said test method further comprising the step of conveying a clock signal from said clocking line to pace a shifting-in of instructions and test input data from said test-data-in line, for shifting data into said chain of boundary-scan testable ICs, and for shifting out test output results onto said test-data-out line.

22. The boundary-scan test method as claimed in claim 21 wherein said printed circuit board comprises a switching network means, said test method further comprising the step of connecting said test-data-in line to one or more of said plurality of test chains by means of said switching network in such a way that an expanded test chain comprising one or more of said test chains coupled in series is created so test data can be shifted into and out from said expanded test chain.

23. The boundary-scan test method as claimed in claim 22 wherein said printed circuit board contains a test chain controller comprising a plurality of four-state finite state machines (four-state machines), each of said four-state machines having a test-mode-selector line input and a local test-mode-selector line output for each of said plurality of test chains and having a first state (Park-Reset State), a second state (Park-Idle State), a third state (Sync State), and a fourth state (Local-On State), said test method/further comprising the step of using any one of said plurality of four-state machines in said Park-Reset state to force said local test-mode-selector line output to drive said boundary-scan testable ICs into a local reset state, and moving said four-state machine from either said Park-Reset State or said Park-Idle State to said Sync State by said central test controller transmitting a particular unpark command, with said four-state machine in said Sync state acting to correlate signals from said input with said output so as to synchronize said boundary-scan-testable ICs with said central test controller.

24. A boundary-scan test method for testing an electronic system having a plurality of printed circuit boards, each of said plurality of printed circuit boards having one or more test chains of boundary-scan-testable integrated circuits (ICs), wherein each of said printed circuit boards is removably insertable into any one of a plurality of circuit board slots connected to a backplane test bus, said test method comprising the steps of:

(a) establishing particular board identifiers for each of said plurality of printed circuit boards;

(b) selecting any one of said plurality of printed circuit boards using a board selection device, said board selection device comprising a plurality of individual board selectors corresponding in number to that of said printed circuit boards;

(c) transferring a first boundary-scan input test vector from a central test controller to a first particular test chain of a selected printed circuit board;

(d) parking said first particular chain with said first input test vector remaining in said first particular chain; and (e) transferring a first output test vector out from a second particular test chain.

25. The boundary-scan test method as claimed in claim 24, the steps of selecting any one of said printed circuit boards and transferring test vectors further comprising:

(a) causing an identifier transmitted by said central test controller to said particular individual board selectors to be compared with a particular board identifier of a first corresponding printed circuit board;

(b) establishing that said identifier matches said particular board identifier;

(c) enabling a boundary-scan test input vector to be transferred from said backplane test bus to said particular test chain of said first corresponding printed circuit board and a boundary-scan test output vector to be transferred from said particular test chain of said first corresponding printed circuit board to said backplane test bus, wherein said board selection device can be used to compare a particular board identifier of a second corresponding printed circuit board without removing said boundary-scan test input vector from said first corresponding printed circuit board.

* * * * *